United States Patent
Lee

(10) Patent No.: US 11,588,035 B2
(45) Date of Patent: Feb. 21, 2023

(54) SEMICONDUCTOR DEVICES

(71) Applicant: SAMSUNG ELECTRONICS CO., LTD., Suwon-si (KR)

(72) Inventor: Jaegoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 77 days.

(21) Appl. No.: 16/998,342

(22) Filed: Aug. 20, 2020

(65) Prior Publication Data
US 2021/0193812 A1     Jun. 24, 2021

(30) Foreign Application Priority Data

Dec. 24, 2019   (KR) .......................... 10-2019-0173879

(51) Int. Cl.
*H01L 29/423*       (2006.01)
*H01L 27/11556*   (2017.01)
*H01L 27/11582*   (2017.01)

(52) U.S. Cl.
CPC .. H01L 29/42372 (2013.01); H01L 27/11556 (2013.01); H01L 27/11582 (2013.01)

(58) Field of Classification Search
CPC .................. H01L 27/11582; H01L 27/11575
See application file for complete search history.

(56) References Cited

U.S. PATENT DOCUMENTS

| | | | |
|---|---|---|---|
| 8,338,882 B2 | 12/2012 | Tanaka et al. | |
| 8,372,720 B2 | 2/2013 | Fukuzumi et al. | |
| 8,378,406 B2 | 2/2013 | Katsumata et al. | |
| 8,912,060 B2 | 12/2014 | Uenaka et al. | |
| 8,928,149 B2 | 1/2015 | Chen | |
| 9,419,013 B1* | 8/2016 | Lee | ........................ H01L 23/535 |
| 10,770,471 B2* | 9/2020 | Shimizu | ............ H01L 27/11582 |
| 2013/0234232 A1 | 9/2013 | Yahashi | |
| 2017/0278859 A1* | 9/2017 | Sharangpani | ..... H01L 27/11556 |
| 2019/0013237 A1 | 1/2019 | Nam et al. | |
| 2021/0104472 A1* | 4/2021 | Shimamoto | ......... H01L 27/1157 |

FOREIGN PATENT DOCUMENTS

| | | |
|---|---|---|
| JP | 5142692 | 11/2012 |
| KR | 10-1087476 | 11/2011 |
| KR | 10-2019-006142 | 1/2019 |

* cited by examiner

*Primary Examiner* — Raj R Gupta
(74) *Attorney, Agent, or Firm* — F. Chau & Associates, LLC

(57) ABSTRACT

A semiconductor device includes a substrate having a first region and a second region, gate electrodes stacked in the first region and forming a pad region having a stepped shape extending by different lengths in the second region, interlayer insulating layers alternately stacked with the gate electrodes, channel structures passing through the gate electrodes in the first region and including a channel layer, separation regions passing through the gate electrodes in the first and second regions, an etch-stop layer disposed on uppermost gate electrodes, among the gate electrodes forming the pad region in the second region, not to overlap the first region and the separation regions, a cell region insulating layer covering the gate electrodes and the etch-stop layer, and contact plugs passing through the cell region insulating layer and the etch-stop layer in the second region and connected to the gate electrodes in the pad region.

19 Claims, 26 Drawing Sheets

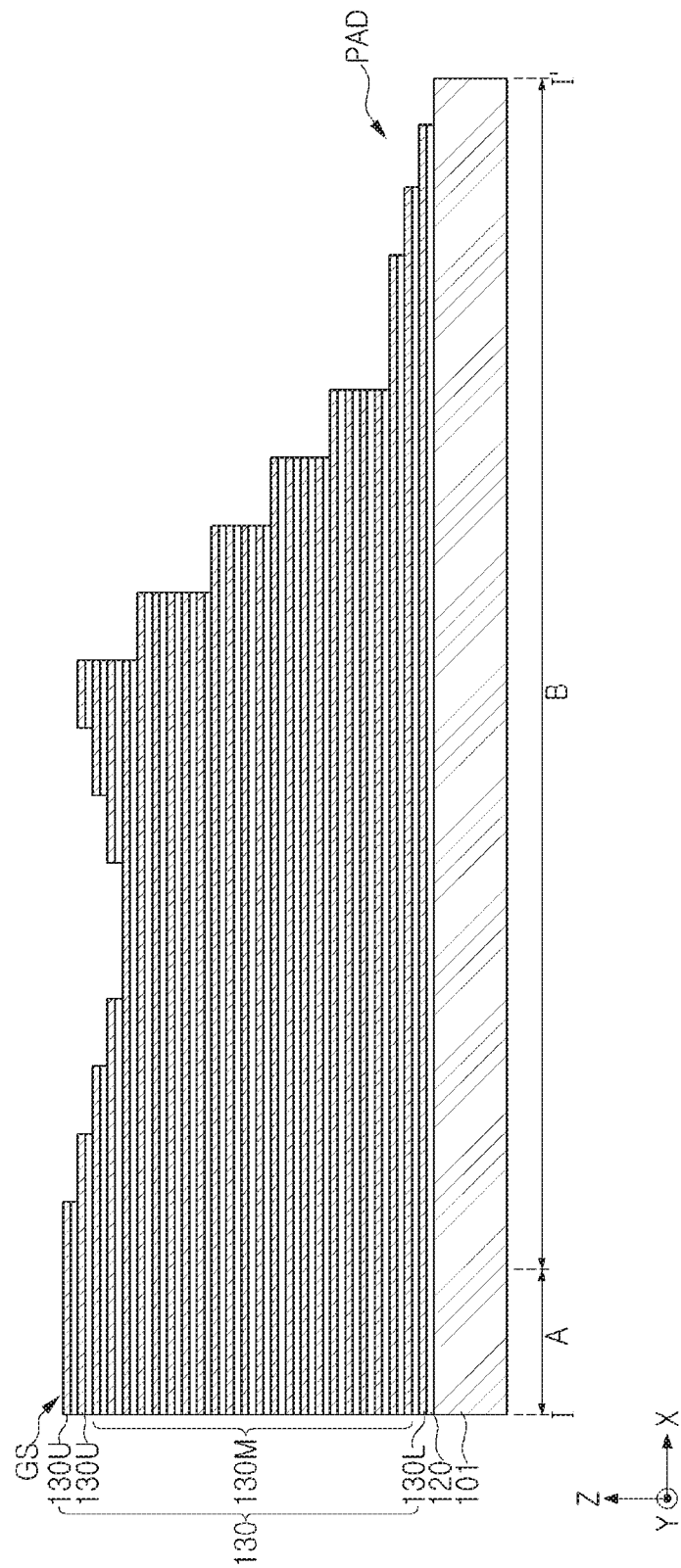

SEMICONDUCTOR DEVICES

CROSS-REFERENCE TO RELATED APPLICATION(S)

This U.S. non-provisional patent application claims benefit of priority under 35 U.S.C. 119(a) to Korean Patent Application No. 10-2019-0173879 filed on Dec. 24, 2019 in the Korean Intellectual Property Office, the disclosure of which is incorporated by reference in its entirety herein.

BACKGROUND

1. Technical Field

The present inventive concept relates to semiconductor devices.

2. Discussion of Related Art

A semiconductor device is an electronic component that relies on electronic properties of a semiconductor material for its function. Semiconductor devices are becoming smaller and require high capacity data processing. Accordingly, it is necessary to increase a degree of integration of semiconductor elements constituting such semiconductor devices. The degree of integration of a semiconductor device having a vertical transistor structure is significantly higher than a conventional planar transistor structure.

SUMMARY

At least one example embodiment of the present inventive concept provides a semiconductor device having improved reliability.

According to an example embodiment of the present inventive concept, a semiconductor device includes a substrate having a first region and a second region; gate electrodes stacked in the a first direction on the substrate and spaced apart from each other in the first region, the gate electrodes extending along a second direction into the second region by different lengths to form a pad region having a stepped shape; interlayer insulating layers alternately stacked with the gate electrodes; channel structures passing through the gate electrodes in the first region, extending in the first direction, and including a channel layer; separation regions passing through the gate electrodes in the first and second regions and extending in the second direction; an etch-stop layer disposed on uppermost gate electrodes, among the gate electrodes forming the pad region in the second region, not to overlap the first region and the separation regions; a cell region insulating layer covering the gate electrodes and the etch-stop layer; and contact plugs passing through the cell region insulating layer and the etch-stop layer from an upper portion in the second region and connected to the gate electrodes in the pad region.

According to an example embodiment of the present inventive concept, a semiconductor device includes gate electrodes stacked in a first direction on the substrate and spaced apart from each other, the gate electrodes extending by different lengths along a second direction to form a pad region having a stepped shape; separation regions passing through the gate electrodes and extending in the second direction; an etch-stop layer disposed on uppermost gate electrodes, among the gate electrodes forming the pad region; and contact plugs passing through the etch-stop layer and connected to the gate electrodes in the pad region, wherein the etch-stop layer is spaced apart from side surfaces of the separation regions.

According to an example embodiment of the present inventive concept, a semiconductor device includes a substrate having a first region and a second region; gate electrodes stacked in a first direction on the substrate and spaced apart from each other in the first region, the gate electrodes extending along a second direction into the second region by different lengths to form a pad region having a stepped shape; channel structures passing through the gate electrodes in the first region, extending in the first direction, and including a channel layer; separation regions passing through the gate electrodes in the first and second regions and extending in the second direction; an etch-stop layer disposed on uppermost gate electrodes, among the gate electrodes forming the pad region in the second region; and contact plugs passing through the etch-stop layer and connected to the gate electrodes in the pad region, wherein, a first end portion of the etch-stop layer in the second direction is located at a boundary between the first region and the second region, and opposing sides of the etch-stop layer in the first direction are in contact with side surfaces of the separation regions or are spaced apart from the separation regions.

BRIEF DESCRIPTION OF DRAWINGS

The present inventive concept will be more clearly understood from the following detailed description, taken in conjunction with the accompanying drawings, in which:

FIGS. 10A to 15B are schematic plan and cross-sectional views illustrating a method of manufacturing a semiconductor device according to an example embodiment of the inventive concept.

DETAILED DESCRIPTION OF THE EXAMPLE EMBODIMENTS

Hereinafter, example embodiments of the present inventive concept will be described with reference to the accompanying drawings.

Figure 1:
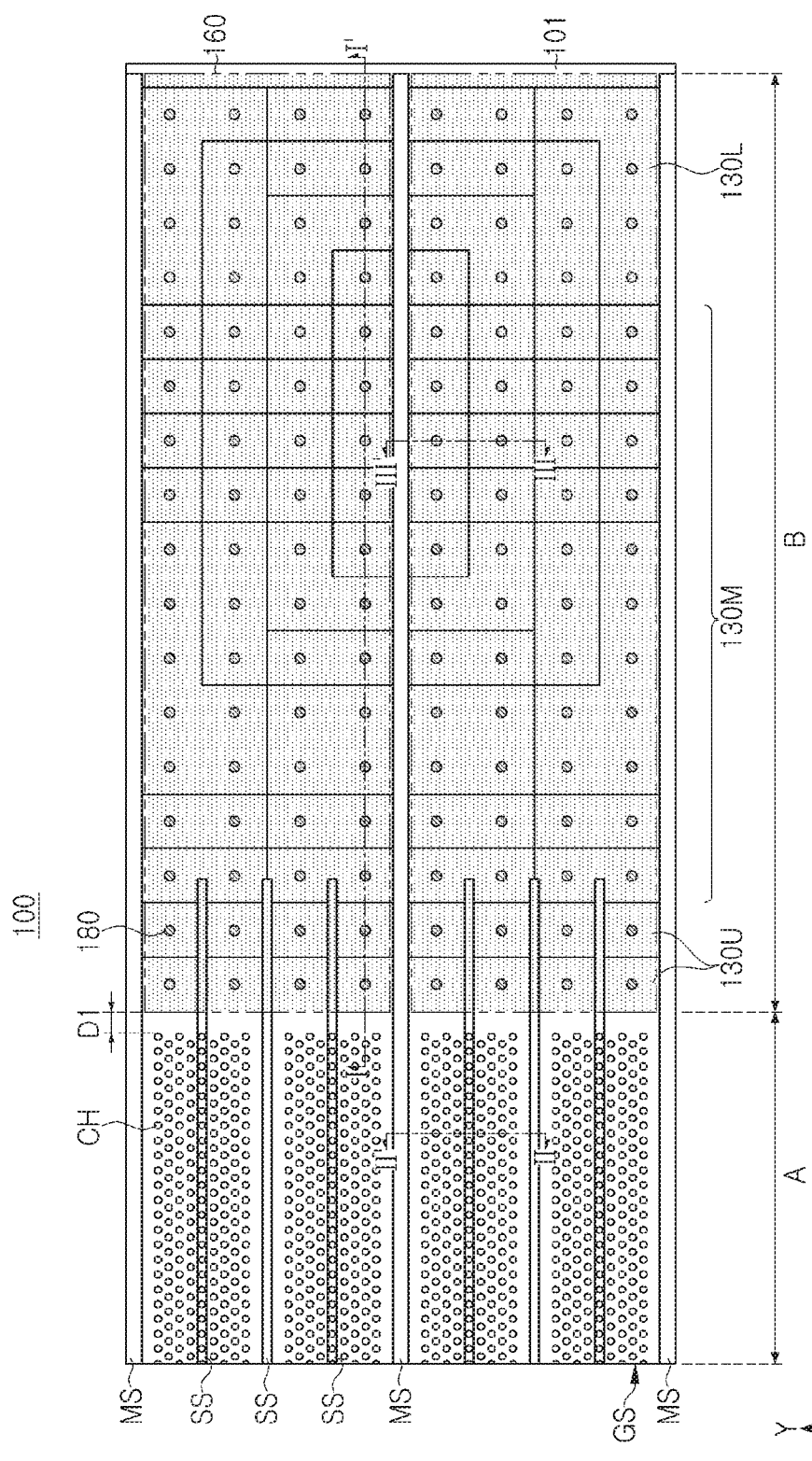
FIG. 1 is a schematic plan view illustrating a semiconductor device according to an example embodiment of the inventive concept.

FIG. 1 is a schematic plan view illustrating a semiconductor device according to an example embodiment of the inventive concept.

Figure 2A:
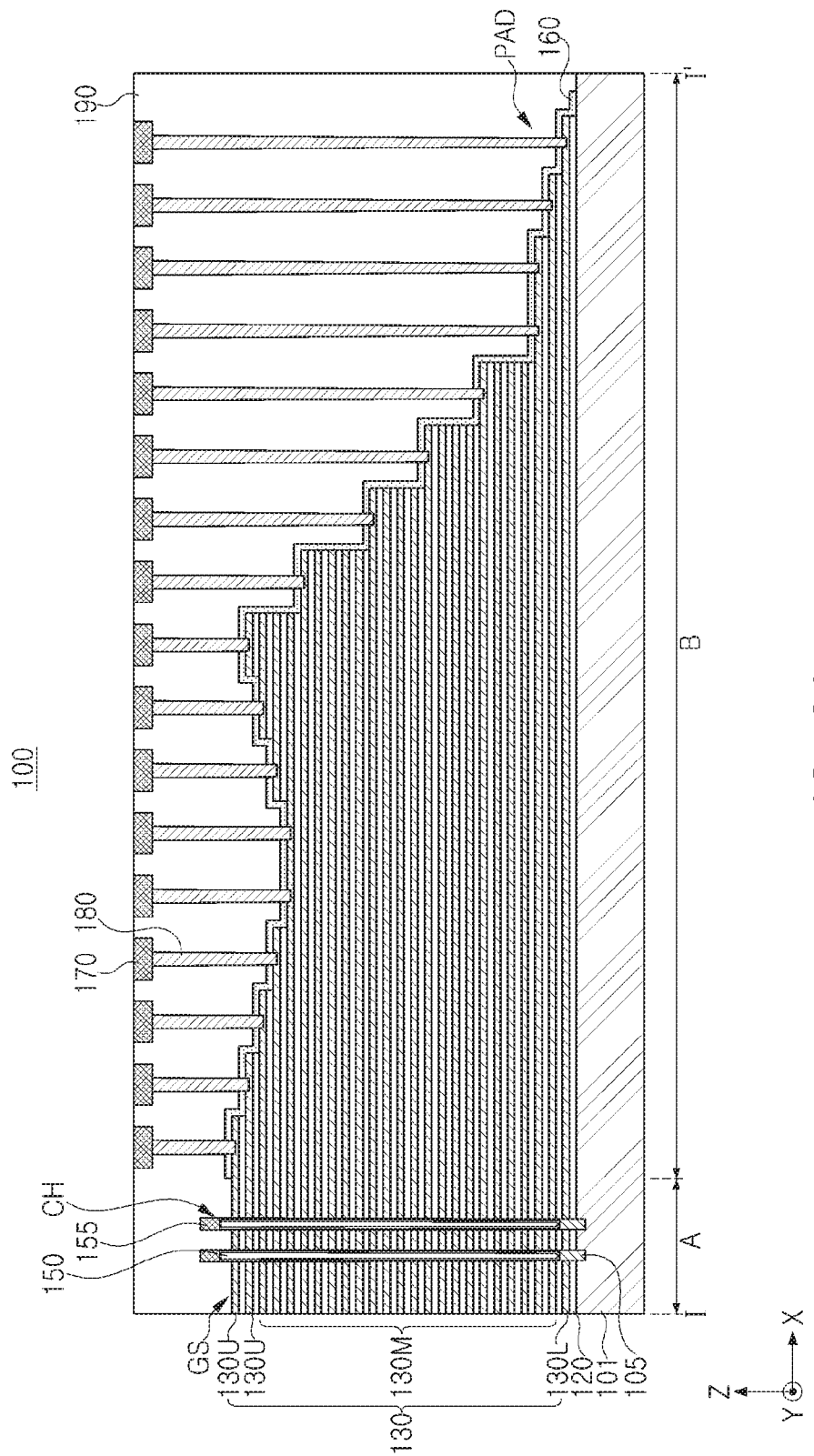
FIGS. 2A to 2C are schematic cross-sectional views illustrating a semiconductor device according to example embodiments of the inventive concept.
Figure 2B:
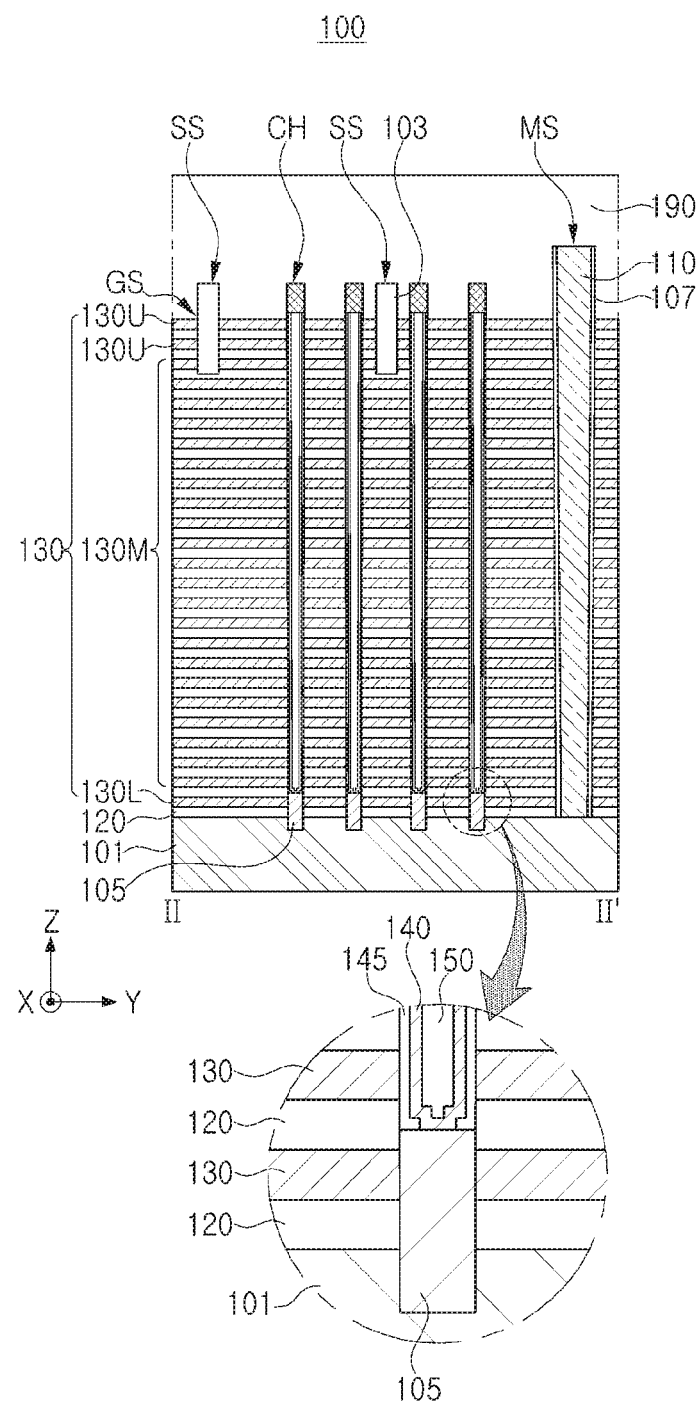
Figure 2C:
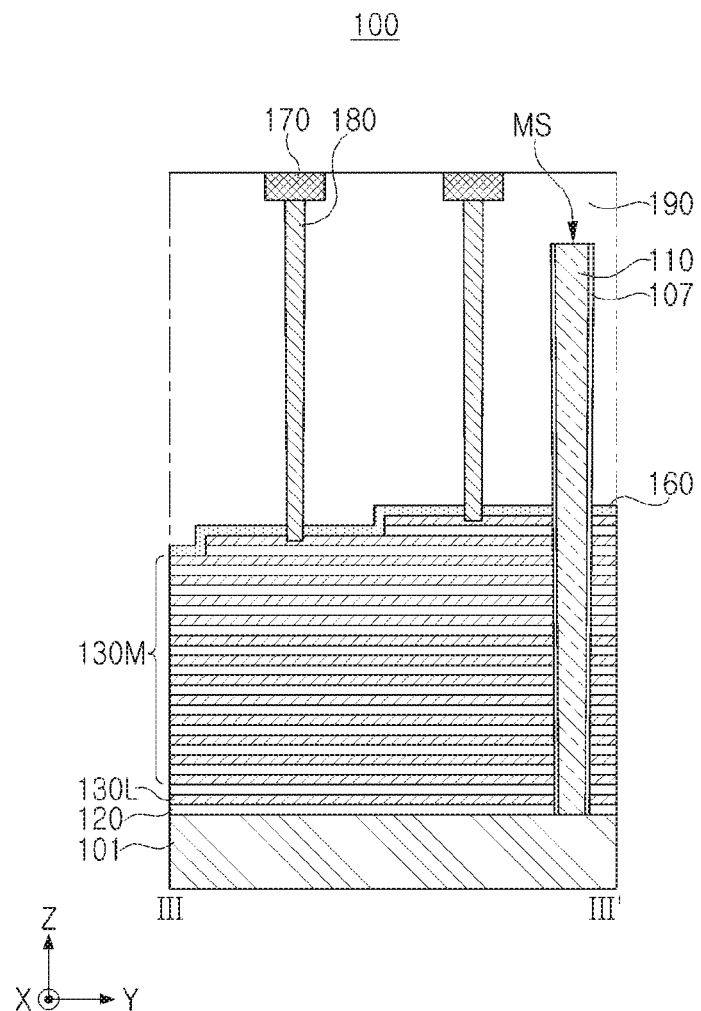

FIGS. 2A to 2C are schematic cross-sectional views illustrating a semiconductor device according to example embodiments of the inventive concept. FIGS. 2A to 2C illustrate cross-sectional views taken along lines I-I', II-II', and III-III' of the semiconductor device of FIG. 1, respectively.

Referring to FIGS. 1 to 2C, a semiconductor device 100 includes a substrate 101 having a first region A and a second region B, gate electrodes 130 stacked on the substrate 101, channel structures CH disposed in the first region A to pass through the gate electrodes 130, separation regions MS passing through the gate electrodes 130 and extending in the first and second regions A and B, an etch-stop layer 160 disposed on uppermost gate electrodes 130 among the gate electrodes 130 in a portion of the second region B, and contact plugs 180 passing through the etch-stop layer 160 and connected to the gate electrodes 130. In an example embodiment, a part of an uppermost gate electrode 130 disposed in the first region A is not covered by the etch-stop layer 160. In an example embodiment, each of the channel structures CH includes an epitaxial layer 105, a channel layer 140, a gate dielectric layer 145, a channel insulating layer 150, and a channel pad 155. The semiconductor device 100 may further include interlayer insulating layers 120 stacked alternately with the gate electrodes 130 on the substrate 101, upper separation regions SS passing through a portion of gate electrodes 130, and a cell region insulating layer 190. For example, a separation region SS could pass through some of the uppermost gate electrodes 130.

In an example embodiment, the first region A of the substrate 101 is a region in which the gate electrodes 130 are vertically stacked and the channel structures CH are disposed, and may be a region in which memory cells are disposed. In an example embodiment, the second region B is a region in which the gate electrodes 130 extend by different lengths and may correspond to a region for electrically connecting memory cells and circuit elements of a peripheral circuit region driving the memory cells. The second region B may be disposed adjacent at least one end of the first region A in at least one direction, for example, in an x direction.

The substrate 101 may have an upper surface extending in x and y directions. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer or an epitaxial layer.

The gate electrodes 130 may be alternately stacked with the interlayer insulating layers 120 to form a stacked structure GS. The gate electrodes 130 may include a lower gate electrode 130L forming a ground select transistor, memory cell gate electrodes 130M forming memory cells, and upper gate electrodes 130U forming a string select transistor, sequentially from the substrate 101. The number of memory cell gate electrodes 130M may be determined according to capacity of the semiconductor device 100. In some embodiments, the lower gate electrode 130L and the upper gate electrodes 130U may be one or two or more, respectively, and may have the same or different structure as the memory cell gate electrodes 130M. In an example embodiment, the upper gate electrodes 130U further include an upper gate electrode 130U disposed in an upper portion of the string select transistor, and forming an erase transistor used for an erase operation using a gate induced drain current (GIDL) phenomenon. In an example embodiment, a portion of gate electrodes 130, for example, a portion of the memory cell gate electrodes 130M adjacent to the lower gate electrode 130L and the upper gate electrodes 130U are dummy gate electrodes.

The gate electrodes 130 may be stacked vertically spaced apart from each other in the first region A, and may extend by different lengths in the second region B to form a pad region PAD having a step difference structure having a stepped shape. In the present specification, the pad region PAD may be used as a term referring to an entire region having a stepped shape in which a relative lower gate electrode 130 extends longer than an upper gate electrode 130 to expose an end portion of the lower gate electrode 130. As illustrated in FIG. 2A, in at least a portion of the gate electrodes 130 except for the lower gate electrode 130L and the upper gate electrodes 130U, a predetermined number of gate electrodes 130, for example, one, two, four, or six gate electrodes 130 form one gate group to form a step difference structure between gate groups in the x direction. As illustrated in FIGS. 1 and 2C, gate electrodes 130 forming one gate group may be arranged to have a step difference structure with respect to each other in the y direction.

As illustrated in FIG. 1, gate electrodes 130 may be separated from adjacent gate electrodes 130 in the y direction by a pair of separation regions MS extending in the x direction. The gate electrodes 130 between the pair of separation regions MS may form a single memory block, but a range of the single memory block is not limited thereto. A portion of the gate electrodes 130, for example, the memory cell gate electrodes 130M may form one layer in the single memory block. The gate electrodes 130 may include a semiconductor material, for example, polycrystalline silicon (Si).

The interlayer insulating layers 120 may be disposed between the gate electrodes 130. Like the gate electrodes 130, the interlayer insulating layers 120 may be disposed to be spaced apart from each other in a direction, perpendicular to the upper surface of the substrate 101, and may extend in the x direction. The interlayer insulating layers 120 may include an insulating material such as silicon oxide or silicon nitride.

The separation regions MS may be disposed to pass through the gate electrodes 130 in the first region A and the second region B and extend in the x direction. In an example embodiment of the inventive concept, the separation regions MS are disposed in parallel with each other. The separation regions MS may be connected to the substrate 101 through the entire gate electrodes 130 stacked on the substrate 101. In embodiments, an arrangement position, the number, and the like of the separation regions MS are not limited to those illustrated in FIG. 1.

As illustrated in FIGS. 2B and 2C, a conductive layer 110 and separation insulating layers 107 are arranged in the separation region MS. The conductive layer 110 may be spaced apart from the gate electrodes 130 by the separation insulating layers 107. The conductive layer 110 may function as a common source line of the semiconductor device 100 or a contact plug connected to the common source line.

The upper separation regions SS may extend between the separation regions MS in the x direction. The upper separation regions SS may be disposed in a portion of the second region B and the first region A to pass through a portion of the gate electrodes 130 including the uppermost gate electrode 130 among the gate electrodes 130. As illustrated in FIG. 2B, the upper separation regions SS may separate, for example, three of the gate electrodes 130 from each other in the y direction. The number of gate electrodes 130 separated by the upper separation regions SS may vary in various embodiments. The upper separation regions SS may include an upper insulating layer 103.

The channel structures CH may form one memory cell string, and may be spaced apart from each other in rows and columns in the first region A. The channel structures CH may be arranged to form a grid or may be arranged to have a zigzag form in one direction. For example, the channel structures CH could be arranged into columns aligned with one another or into columns offset from one another to form a zigzag. The channel structures CH may have a columnar shape, and may have sidewalls such that widths of the channel structures CH become narrower, as they get closer to the substrate 101 according to an aspect ratio. In an example embodiment, the channel structures CH disposed in an end (or edge) portion of the first region A, adjacent to the second region B, are dummy channels. In addition, the channel structures CH overlapping the upper separation regions SS may also be dummy channels. In an example embodiment, the dummy channels have the same or similar structure as the channel structures CH, but do not perform a substantial function in the semiconductor device 100. In an example embodiment, application of a current or voltage to a dummy channel does not affect the state of a memory cell of the semiconductor device 100. In an example embodiment, a dummy channel is not connected to any of the available bit lines.

Referring to the enlarged view of FIG. 2B, the channel layer 140 may be disposed in the channel structure CH. In the channel structure CH, the channel layer 140 may be formed to have an annular shape surrounding the channel insulating layer 150 therein, but may have a columnar shape such as a circular columnar shape or an angular columnar shape without the channel insulating layer 150. A lower portion of the channel layer 140 may be connected to the epitaxial layer 105. The channel layer 140 may include a semiconductor material such as polycrystalline silicon or single crystal silicon, and the semiconductor material may be an undoped material or a material including p-type or n-type impurities.

The gate dielectric layer 145 may be disposed between the gate electrodes 130 and the channel layer 140. In an example embodiment of the inventive concept, the gate dielectric layer 145 extends perpendicular to the upper surface of the substrate 101 along the channel layer 140. Although not specifically illustrated, the gate dielectric layer 145 may include a tunneling layer, a charge storage layer, and a blocking layer, sequentially stacked from the channel layer 140. The tunneling layer may tunnel a charge into the charge storage layer, and may include, for example, silicon oxide ($SiO_2$), silicon nitride ($Si_3N_4$), silicon oxynitride (SiON), or a combination thereof. The charge storage layer may be a charge trapping layer or a floating gate conductive layer. The blocking layer may include silicon oxide ($SiO_2$), silicon nitride ($Si_3N_4$), silicon oxynitride (SiON), a high-k dielectric material, or a combination thereof.

The epitaxial layer 105 may be disposed on the substrate 101 at a lower end of the channel structures CH, and may be disposed on a side surface of at least one gate electrode 130. The epitaxial layer 105 may be disposed in a recessed region of the substrate 101. In an example embodiment, an upper surface of the epitaxial layer 105 is higher than an upper surface of a lowermost gate electrode 130, and is lower than a lower surface of a gate electrode 130, disposed on the lowermost gate electrode 130, but is not limited thereto. In an example embodiment, the epitaxial layer 105 is omitted, in which case the channel layer 140 is directly connected to the substrate 101.

The channel pad 155 may be disposed on the channel layer 140 in the channel structure CH. The channel pad 155 may be disposed to cover an upper surface of the channel insulating layer 150 and to be electrically connected to the channel layer 140. The channel pad 155 may include, for example, doped polycrystalline silicon. The channel structures CH disposed in a straight line in the y direction between the separation region MS and the upper separation region SS may be connected to different bit lines according to an arrangement of an upper wiring structure connected to the channel pads 155, respectively.

In an example embodiment, the etch-stop layer 160 is disposed on upper surfaces of the uppermost gate electrodes 130, among the gate electrodes 130 forming the pad region PAD. The etch-stop layer 160 may be a layer for controlling an etch depth, when the contact plugs 180 are formed. For example, the etch-stop layer 160 may prevent a contact plug 180 from passing through more than a single uppermost gate electrode. The etch-stop layer 160 may extend from an upper portion to a lower portion to have a stepped shape along the pad region PAD. In detail, the etch-stop layer 160 may cover exposed upper surfaces and side surfaces of the uppermost gate electrodes 130, and may extend to cover side surfaces of the interlayer insulating layers 120.

The etch-stop layer 160 may be disposed in a portion of the second region B in which the separation regions MS are not disposed. Therefore, the etch-stop layer 160 does not overlap the first region A and the separation regions MS in the plan view, as illustrated in FIG. 1. The etch-stop layer 160 may be disposed in a single layer between a pair of separation regions MS. In an example embodiment, the etch-stop layer 160 is spaced apart from the channel structure CH, closest to the second region B, by a first distance D1. The etch-stop layer 160 may be disposed to contact side surfaces of the separation regions MS, as illustrated in FIG. 2C. Therefore, the entire etch-stop layer 160 may be disposed to overlap the gate electrodes 130 forming the pad region PAD and a portion of the substrate 101 outside the gate electrodes 130.

A first end portion of the etch-stop layer 160 in the x direction may be located at a boundary between the first region A and the second region B or adjacent to the boundary. A second end portion of the etch-stop layer 160 in the x direction may be located to contact the substrate 101 on the upper surface of the substrate 101. For example, the second portion of the etch-stop layer 160 may contact the upper surface of the substrate 101 in the second region B. In an example embodiment, the second end portion of the etch-stop layer 160 does not extend onto the upper surface of the substrate 101, and is located on the lowermost gate electrode 130. Both end portions of the etch-stop layer 160 in the y direction may be located to contact the side surfaces of the separation regions MS. The etch-stop layer 160 may have a rectangular shape on the plan view of FIG. 1 by the end portions.

In an example embodiment of the inventive concept, the etch-stop layer 160 includes a material different from the gate electrodes 130 and the cell region insulating layer 190. The etch-stop layer 160 may include a metal oxide. In an example embodiment, the etch-stop layer 160 is entirely made from a metal oxide. For example, the etch-stop layer 160 may include any one of aluminum oxide ($Al_xO_y$), hafnium oxide ($Hf_xO_y$), tantalum oxide ($Ta_xO_y$), titanium oxide ($Ti_xO_y$), yttrium oxide ($Y_xO_y$), zirconium oxide ($Zr_xO_y$), lanthanum oxide ($La_xO_y$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

Since the etch-stop layer 160 may be disposed only in the pad region PAD of the gate electrodes 130 on which the contact plugs 180 are disposed, an etch process may be carried out easily when the channel structures CH and the separation regions MS are formed. In addition, the separation regions MS may be formed such that positions of lower ends of the separation regions MS are maintained on the same or substantially the same height level along the x direction.

The cell region insulating layer 190 may be disposed to cover the substrate 101, the gate electrodes 130, and the etch-stop layer 160. In an example embodiment, the cell region insulating layer 190 includes a plurality of insulating layers. The cell region insulating layer 190 may include an insulating material such as silicon oxide, silicon nitride, or the like.

The contact plugs 180 may pass through the cell region insulating layer 190 and a portion of the etch-stop layer 160 from an upper portion, and may be connected to the uppermost gate electrodes 130, among the gate electrodes 130 forming the pad region PAD, respectively. The contact plugs 180 may partially recess the gate electrodes 130, and may be connected to the gate electrodes 130. For example, a contact plug 180 may extend into a recess of an uppermost gate electrode. The contact plugs 180 may be connected to wiring lines 170 thereon. The contact plugs 180 may electrically connect the gate electrodes 130 to the circuit elements of the peripheral circuit region. In example embodiments, an arrangement position, the number, and shapes of the contact plugs 180 may be variously changed. For example, only one of the contact plugs 180 may be connected to one of the gate electrodes 130. The contact plugs 180 and the wiring lines 170 may include a conductive material, for example, tungsten (W), copper (Cu), aluminum (Al), or the like.

Figure 3A:
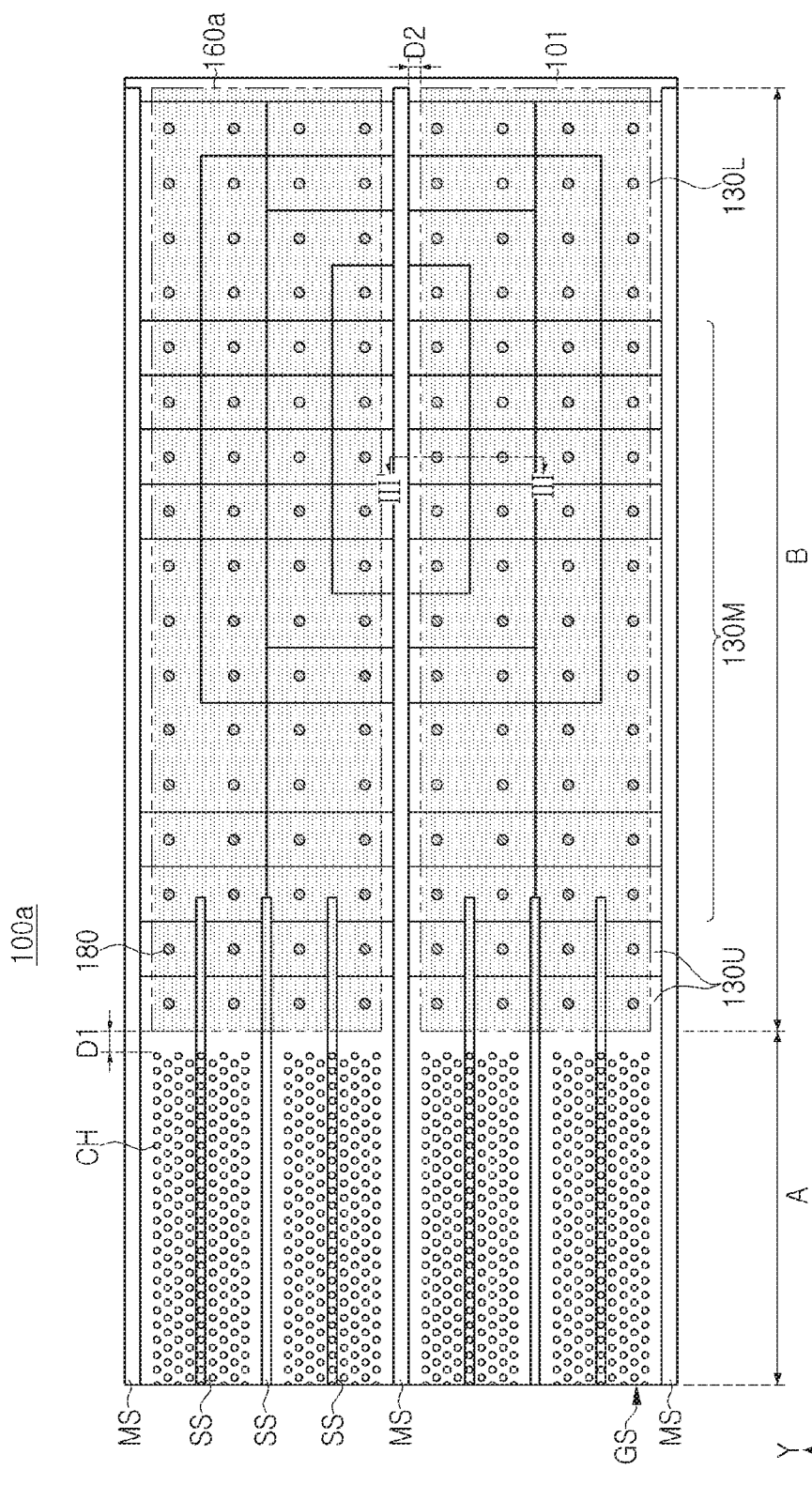
FIGS. 3A and 3B are schematic plan and cross-sectional views illustrating a semiconductor device according to example embodiments of the inventive concept.
Figure 3B:
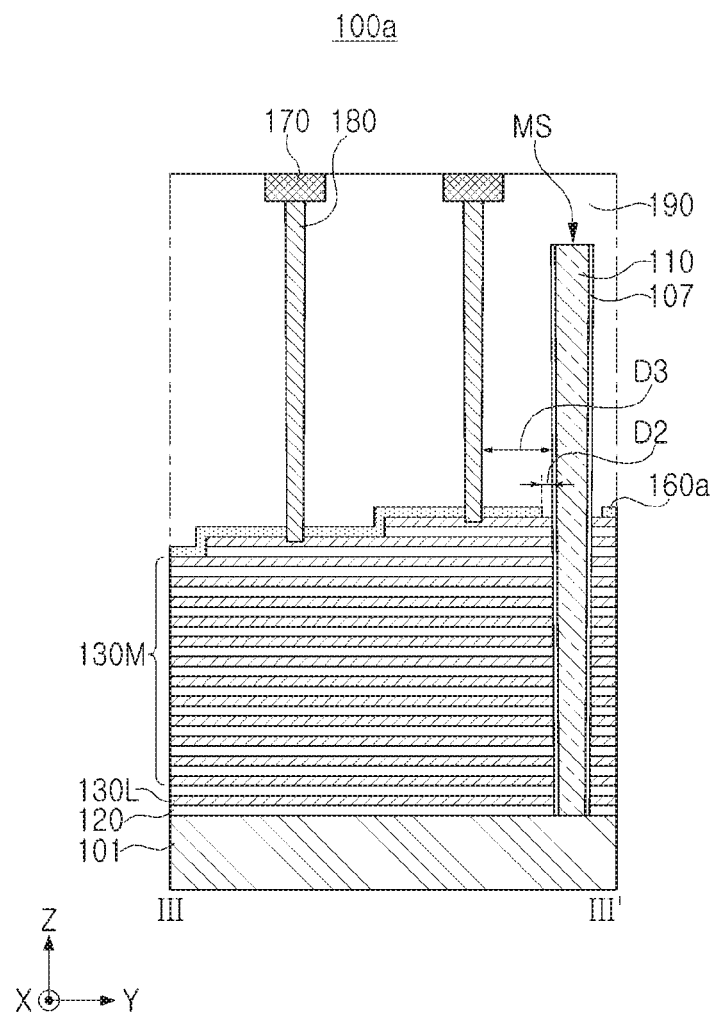

FIGS. 3A and 3B are schematic plan and cross-sectional views illustrating a semiconductor device according to example embodiments. FIG. 3B illustrates a cross-sectional view taken along line III-III' of FIG. 3A.

Referring to FIGS. 3A and 3B, in a semiconductor device 100a, an etch-stop layer 160a is not only spaced apart from a channel structure CH in the x direction by a first distance D1, but is also spaced apart from separation regions MS in the y direction by a second distance D2. In an example embodiment, the second distance D2 is smaller than a third distance D3 between the separation region MS and an adjacent contact plug 180. In detail, the etch-stop layer 160a may be spaced apart from both side surfaces of the separation regions MS in the y direction. In the spaced region, uppermost gate electrodes 130 may be exposed from the etch-stop layer 160a in an upward direction, to contact a cell region insulating layer 190. For example, prior to be covered by the cell region insulation layer 190, the etch-stop layer 160a in the spaced region would be exposed.

In an example embodiment, a preliminary etch-stop layer 160P (see FIGS. 11A and 11B) forming the etch-stop layer 160a, formed before the separation regions MS, is be removed in a region relatively wider than the separation regions MS including regions in which the separation regions MS are formed, to form the etch-stop layer 160a. As a result, the separation regions MS may be stably formed in regions in which the etch-stop layer 160a is not formed.

Figure 4:
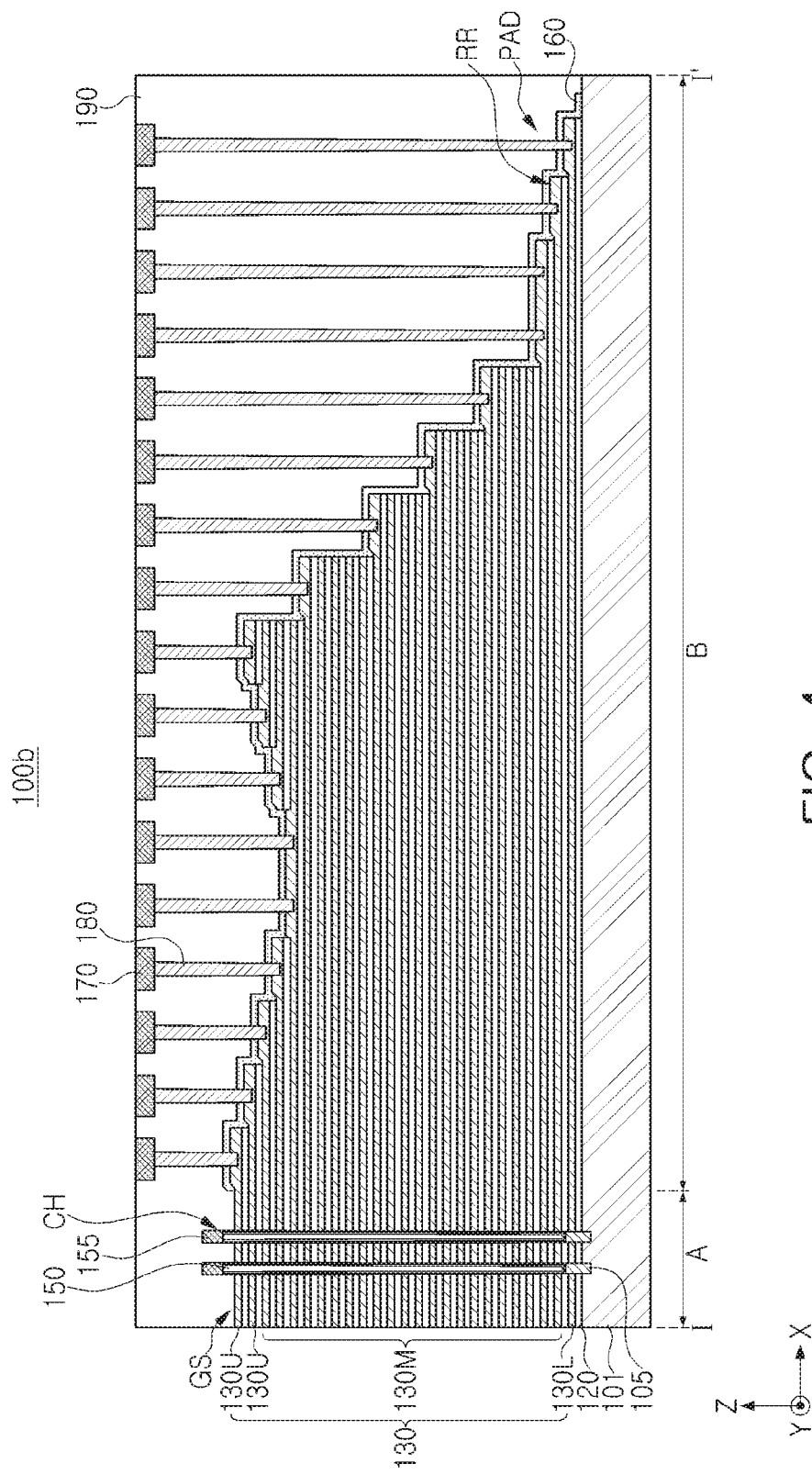
FIG. 4 is a schematic cross-sectional view illustrating a semiconductor device according to example embodiments of the inventive concept.

FIG. 4 is a schematic cross-sectional view illustrating a semiconductor device according to an example embodiment of the inventive concept. FIG. 4 illustrates a region corresponding to FIG. 2A.

Referring to FIG. 4, in a semiconductor device 100b, gate electrodes 130 have end regions RR thickened to be stably connected to contact plugs 180 in a pad region PAD. The contact plugs 180 may be connected to the gate electrodes 130 in the end regions RR of the gate electrodes 130. In this case, the contact plugs 180 may be stably connected to the gate electrodes 130, even when a depth in which the contact plugs 180 recess the gate electrodes 130 is relatively deep. For example, a contact plug 180 may extend into a recess of an uppermost gate electrode through the thickened portion (i.e., an end region RR) of an uppermost gate electrode.

Figure 5A:
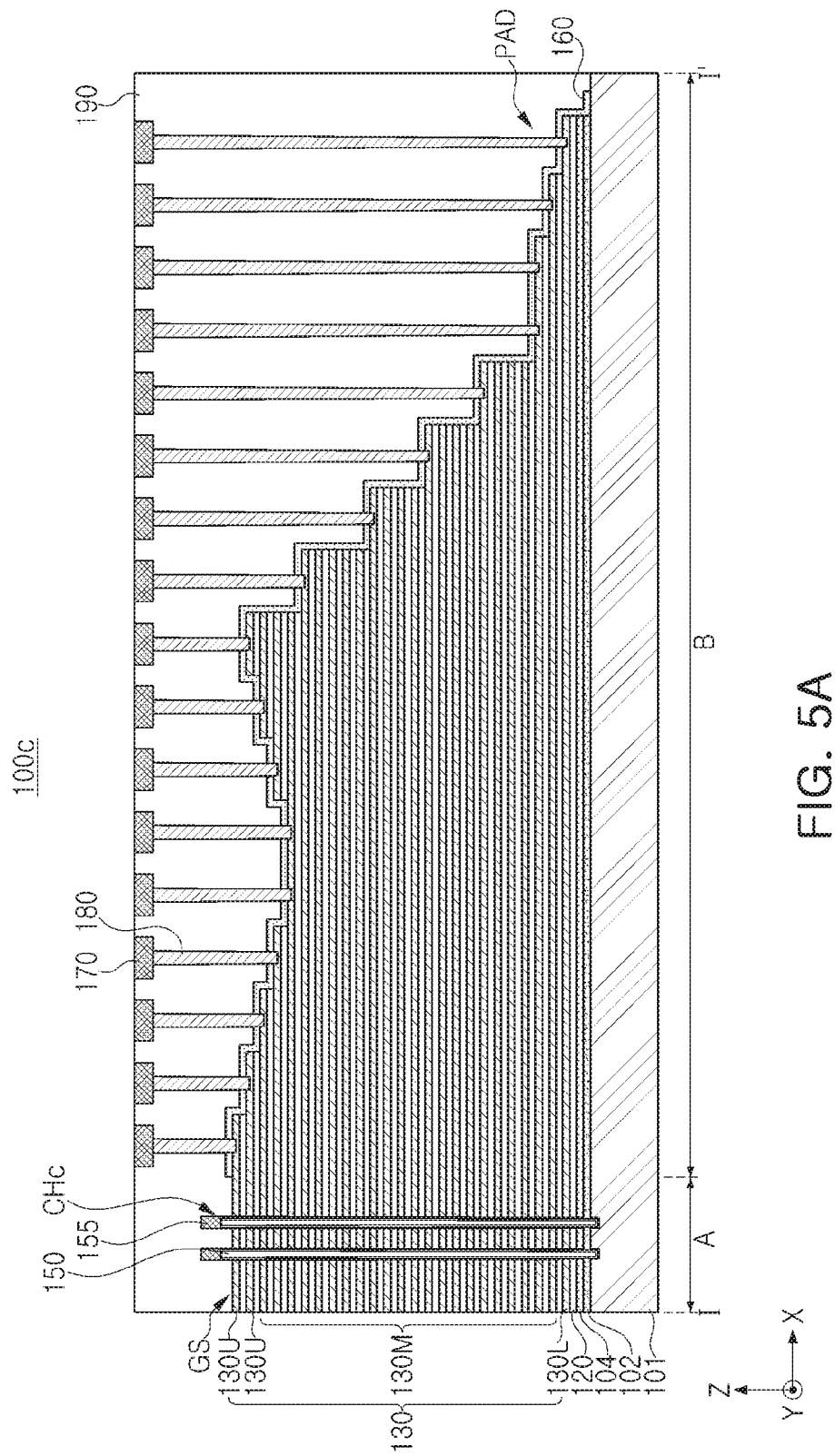
FIGS. 5A and 5B are schematic plan and cross-sectional views illustrating a semiconductor device according to example embodiments of the inventive concept.
Figure 5B:
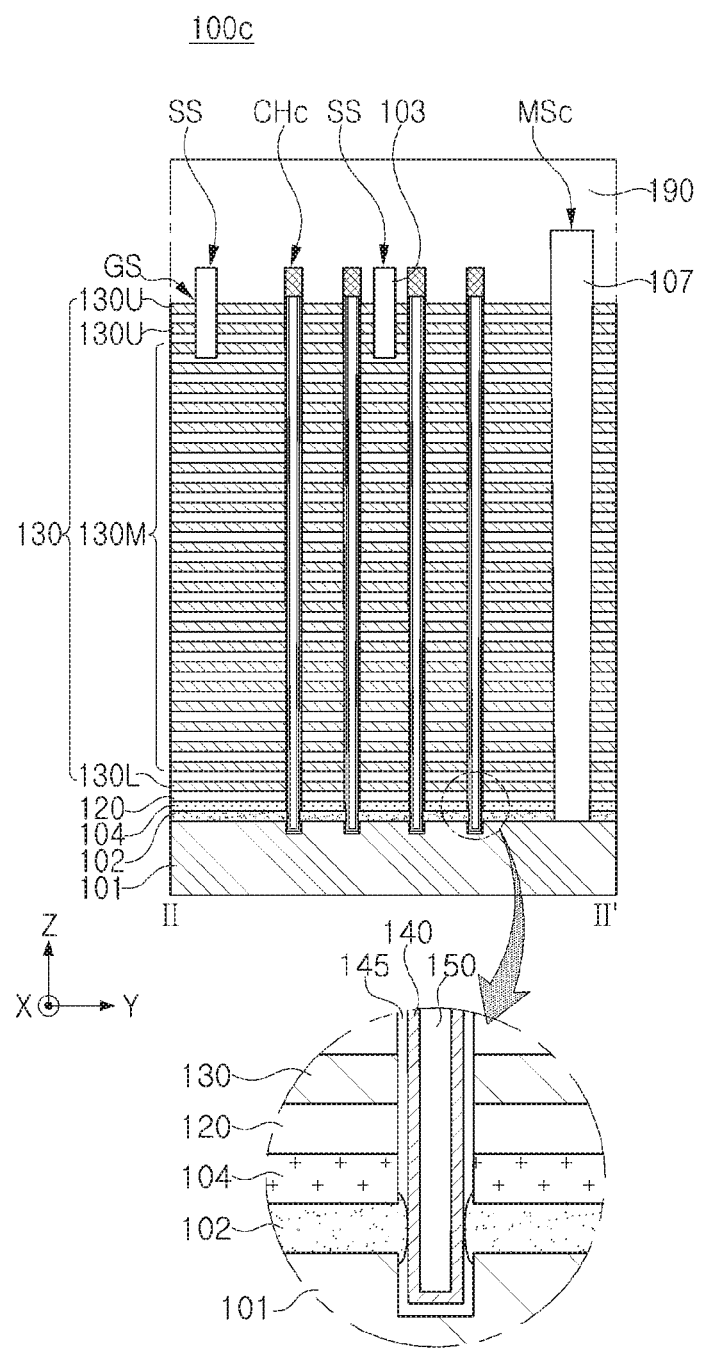

FIGS. 5A and 5B are schematic plan and cross-sectional views illustrating a semiconductor device according to an example embodiment of the inventive concept. FIG. 5A illustrates a region corresponding to FIG. 2A, and FIG. 5B illustrates a region corresponding to FIG. 2B.

Referring to FIGS. 5A and 5B, a semiconductor device 100c further includes first and second horizontal conductive layers 102 and 104 arranged between a substrate 101 and a lowermost interlayer insulating layer 120, on an upper surface of the substrate 101. In addition, in the semiconductor device 100c, a structure of the channel structures CHc may be different from those of the embodiment of FIGS. 1 to 2C, and separation regions MSc may be formed of a separation insulating layer 107. For example, different from the separation regions MS of FIG. 2C, the separation regions MSc do not include the conductive layer 110.

At least a portion of the first and second horizontal conductive layers 102 and 104 may function as a portion of a common source line of the semiconductor device 100c, and may also function as the common source line together with the substrate 101. As illustrated in the enlarged view of FIG. 5B, the first horizontal conductive layer 102 is disposed around a channel layer 140 and directly connect to the channel layer 140. The first and second horizontal conductive layers 102 and 104 may include a semiconductor material, for example, polycrystalline silicon. In this case, at least the first horizontal conductive layer 102 may be a doped layer, and the second horizontal conductive layer 104 may be a doped layer or a layer including impurities diffused from the first horizontal conductive layer 102.

Unlike the channel structures of FIG. 2A, the channel structures CHc do not include an epitaxial layer 105 (refer to FIG. 2A), and may have a structure in which the channel layer 140 extends to a lower end thereof to be connected to the first horizontal conductive layer 102.

Figure 6A:
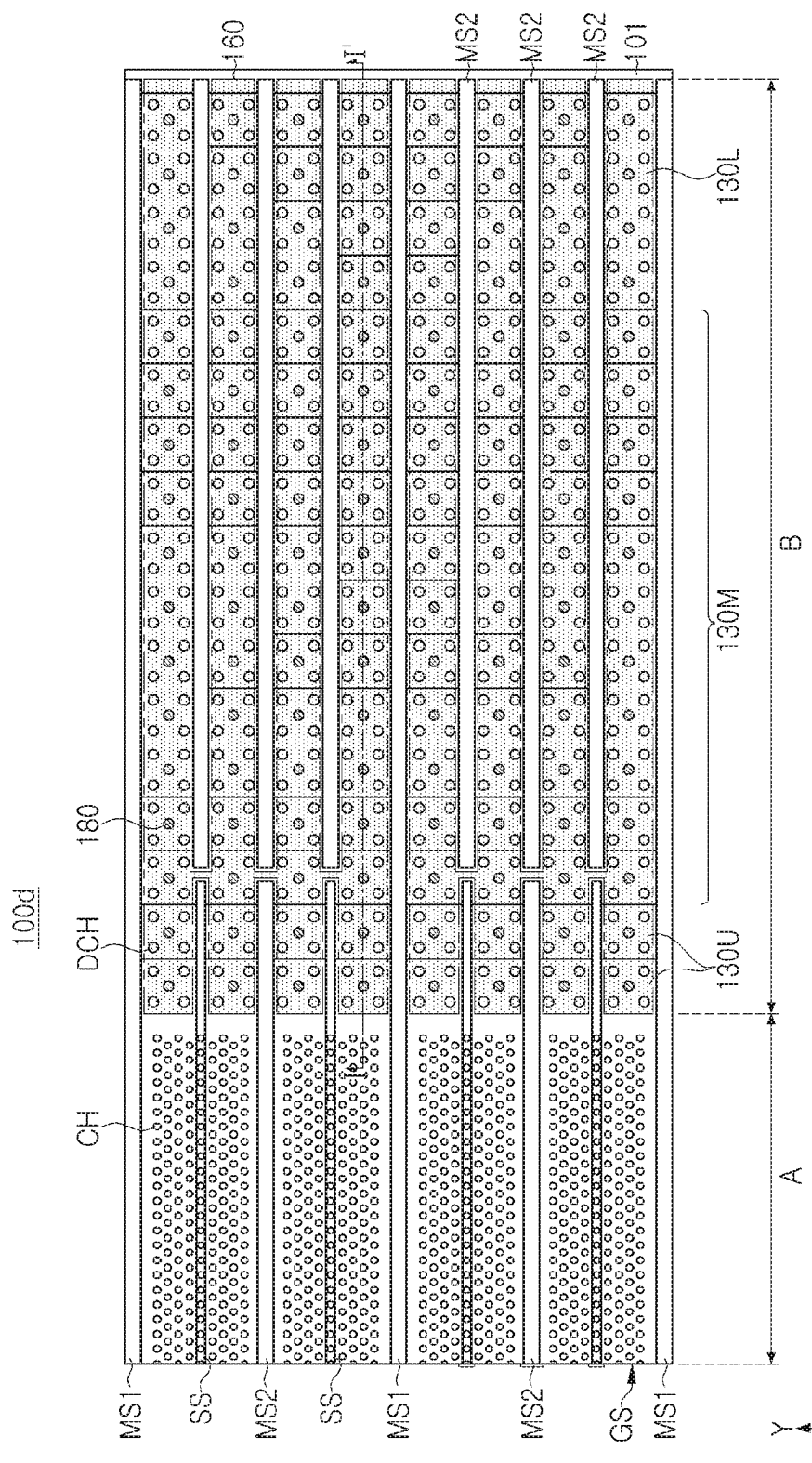
FIGS. 6A and 6B are schematic plan and cross-sectional views illustrating a semiconductor device according to example embodiments of the inventive concept.
Figure 6B:
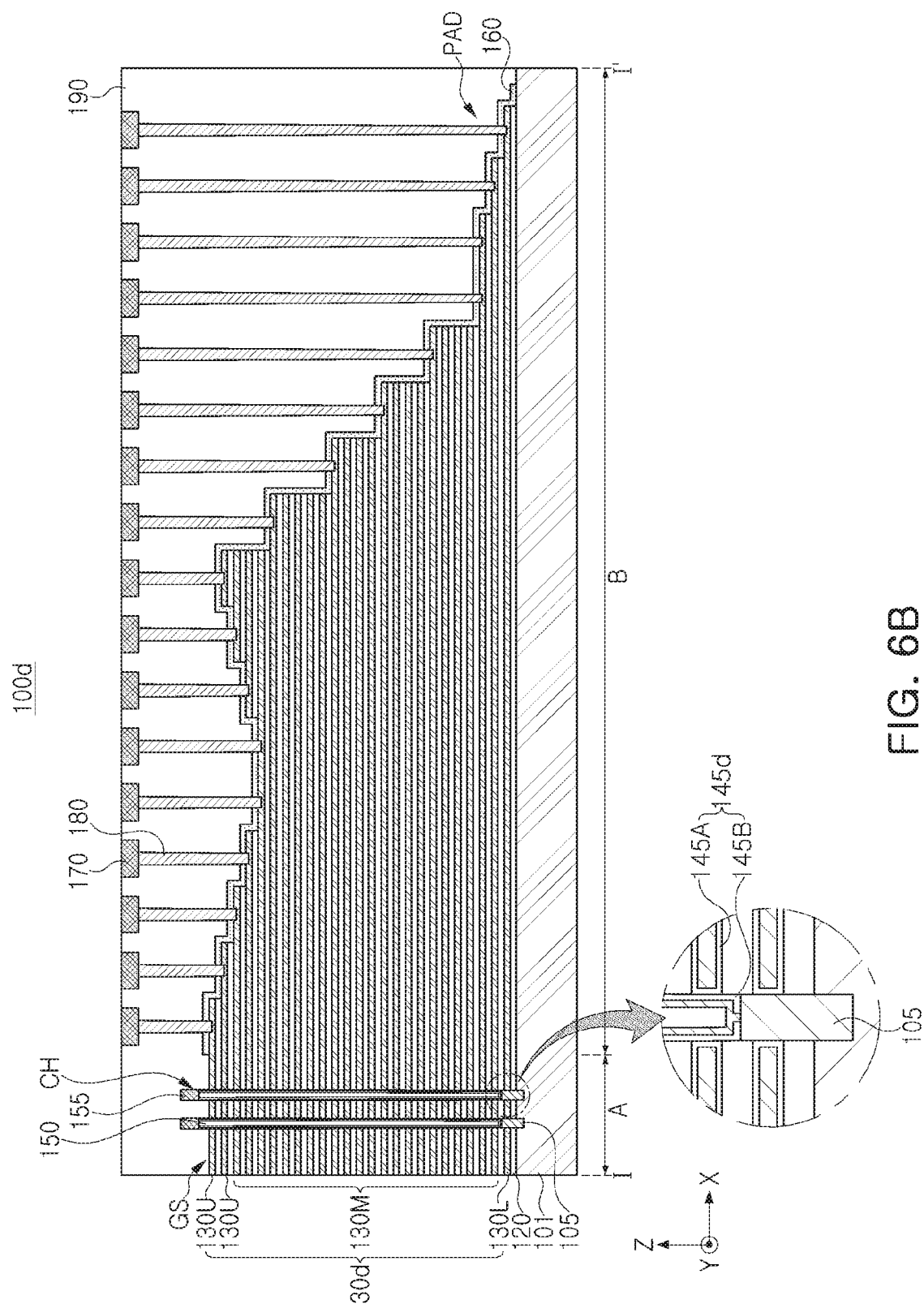

FIGS. 6A and 6B are schematic plan and cross-sectional views illustrating a semiconductor device according to an example embodiment of the inventive concept. FIG. 6B illustrates a cross-sectional view taken along line I-I' of FIG. 6A.

Referring to FIGS. 6A and 6B, in a semiconductor device 100d, a material of gate electrodes 130d and a structure of a gate dielectric layer 145d are different from those of the embodiment of FIGS. 1 to 2C. In addition, the semiconductor device 100d includes first and second separation regions MS1 and MS2 passing through the gate electrodes 130d and extending in the x direction, and may further include dummy channel structures DCH in a second region B of a substrate 101.

In an example embodiment, the gate electrodes 130d include a metal material such as tungsten (W). In an example embodiment, the gate electrodes 130d are entirely made from the metal material. In example embodiments, the gate electrodes 130d may further include a diffusion barrier. For example, the diffusion barrier may include tungsten nitride (WN), tantalum nitride (TaN), titanium nitride (TiN), or combinations thereof.

The gate dielectric layer 145d may include first and second dielectric layers 145A and 145B. The first dielectric layer 145A may extend in the horizontal direction along the gate electrodes 130d to surround the gate electrodes 130d. The second dielectric layer 145B may extend perpendicular to an upper surface of the substrate 101 along a channel structure CH.

In an example embodiment, the first and second separation regions MS1 and MS2 are arranged in parallel with one another. The first and second separation regions MS1 and MS2 may be passed through entire gate electrodes 130 stacked on the substrate 101 to be connected to the substrate 101. The first separation regions MS1 may extend along a first region A and the second region B as a single form, and the second separation regions MS2 may be intermittently arranged in the first region A and the second region B. For example, a first separation region MS1 may include a single unitary layer that extends along the first region A and the second region B. In example embodiments, an arrangement order, the number, and the like of the first and second separation regions MS1 and MS2 may be variously changed. The first and second separation regions MS1 and MS2 may include a conductive layer 110 and separation insulating layers 107, respectively, like the separation regions MS of FIGS. 1 to 2C.

The dummy channel structures DCH may be regularly arranged in the second region B of the substrate 101. For example, the dummy channel structures DCH may be equally spaced from one another. The dummy channel structures DCH may have the same internal structure as the channel structures CH, and may have the same or different size and shape as the channel structures CH.

In the semiconductor device 100d, an etch-stop layer 160 may be disposed so as not to overlap the first and second separation regions MS1 and MS2. The etch-stop layer 160 may be in contact with or spaced apart from side surfaces of the first and second separation regions MS1 and MS2. In an example embodiments, when the dummy channel structures DCH are formed before the etch-stop layer 160, the etch-stop layer 160 may be formed on upper surfaces of the dummy channel structures DCH. Alternatively, in example embodiments, when the etch-stop layer 160 is formed before the dummy channel structures DCH, the dummy channel structures DCH may be disposed to pass through the etch-stop layer 160.

The semiconductor device 100d may be manufactured by a manufacturing method different from that of the semiconductor device 100 of FIGS. 1 to 2C, described with reference to FIGS. 10A to 15B below. Specifically, first, gate sacrificial layers may be alternately stacked with interlayer insulating layers 120, the gate sacrificial layers may be removed through openings formed in regions in which first and second separation regions MS1 and MS2 are arranged, and a first dielectric layer 145A and gate electrodes 130d may be then formed. In the removal operation of the gate sacrificial layers, second separation regions MS2 may be further formed in addition to first separation regions MS1 for easy removal of the gate sacrificial layers. During the removal of the gate sacrificial layers, dummy channel structures DCH may be formed to stably support the stacked structure of the interlayer insulating layers 120.

Figure 7:
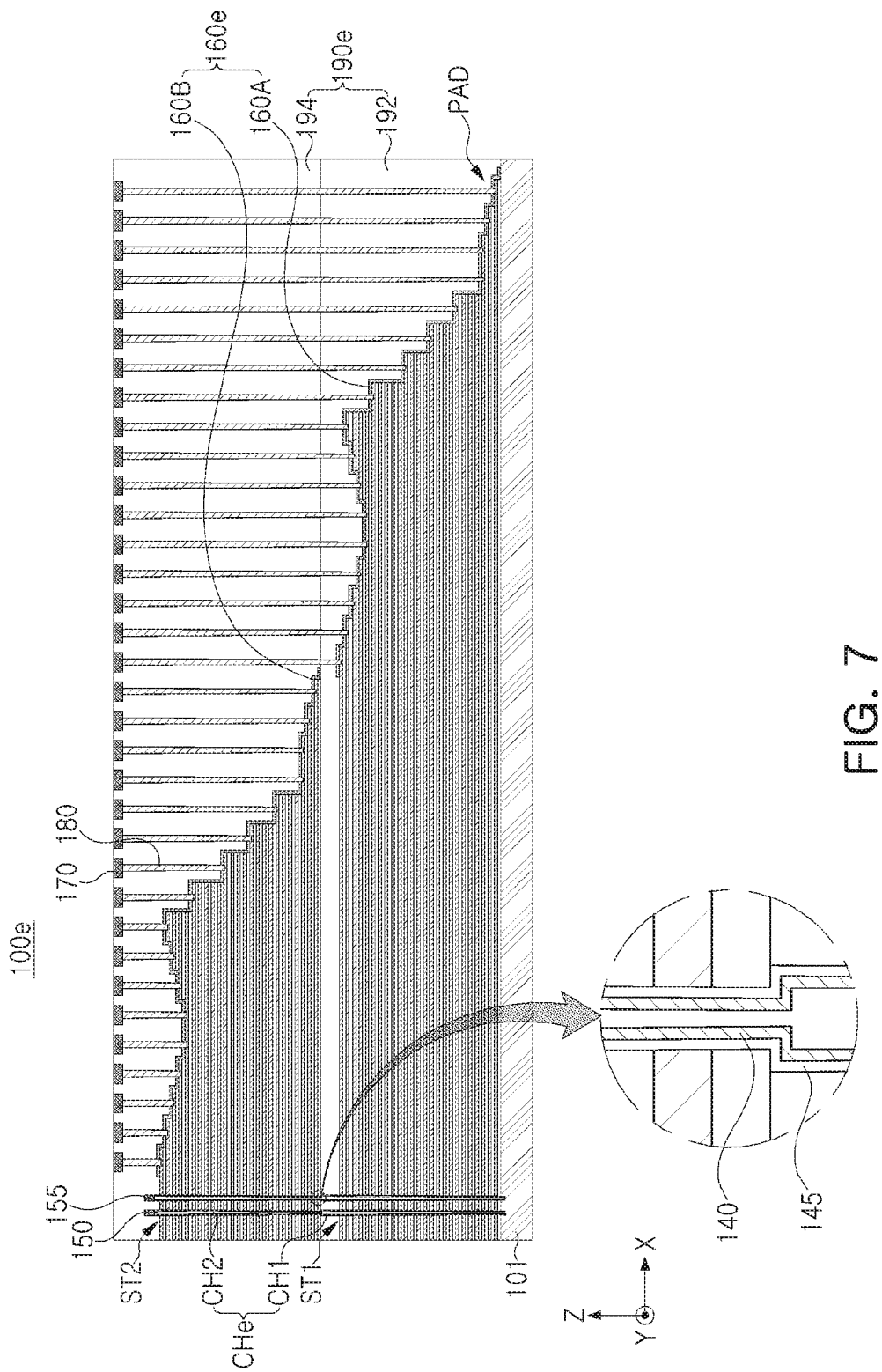
FIG. 7 is a schematic cross-sectional view illustrating a semiconductor device according to example embodiments.

FIG. 7 is a schematic cross-sectional view illustrating a semiconductor device according to an example embodiment of the inventive concept. FIG. 7 illustrates a region corresponding to FIG. 2A.

Referring to FIG. 7, in a semiconductor device 100e, a stacked structure of gate electrodes 130 may include lower and upper stacked structures ST1 and ST2 stacked in the vertical direction, and channel structures CHe may include first and second channel structures CH1 and CH2 stacked in the vertical direction. A structure of the channel structures CHe may be introduced to stably form the channel structures CHe, when the number of the gate electrodes 130 stacked is relatively large.

The channel structures CHe may have a form in which the first channel structures CH1 in a lower portion and the second channel structures CH2 in an upper portion are connected to each other, and have a bend portion due to a difference in width in a region connected to each other. For example, a first channel structure CH1 may be connected to a second channel structure CH2 via a bendable portion. A channel layer 140, a gate dielectric layer 145, and a channel insulating layer 150 may be connected to each other between the first channel structure CH1 and the second channel structure CH2. In an example embodiment, a channel pad 155 is disposed only on an upper end of the second channel structure CH2 in the upper portion. In another example embodiment, each of the first channel structure CH1 and the second channel structure CH2 include the channel pad 155, and in this case, the channel pad 155 of the first channel structure CH1 may be connected to the channel layer 140 of the second channel structure CH2.

The gate electrodes 130 may form a pad region PAD having a stepped shape while forming a stepped structure in the lower stacked structure ST1 and the upper stacked structure ST2, respectively. A cell region insulating layer 190e may include a first insulating layer 192 covering the lower stacked structure ST1 and a second insulating layer 194 covering the upper stacked structure ST2.

An etch-stop layer 160e may include a first etch-stop layer 160A disposed on the gate electrodes 130 of the lower stacked structure ST1 and a second etch-stop layer 160B disposed on the gate electrodes 130 of the upper stacked structure ST2. In an example embodiment, the first etch-stop layer 160A and the second etch-stop layer 160B are spaced apart from each other in the vertical direction. For example, the first etch-stop layer 160A and the second etch-stop layer 160B may be spaced apart due to the first insulating layer 192 being disposed therebetween.

Figure 8:
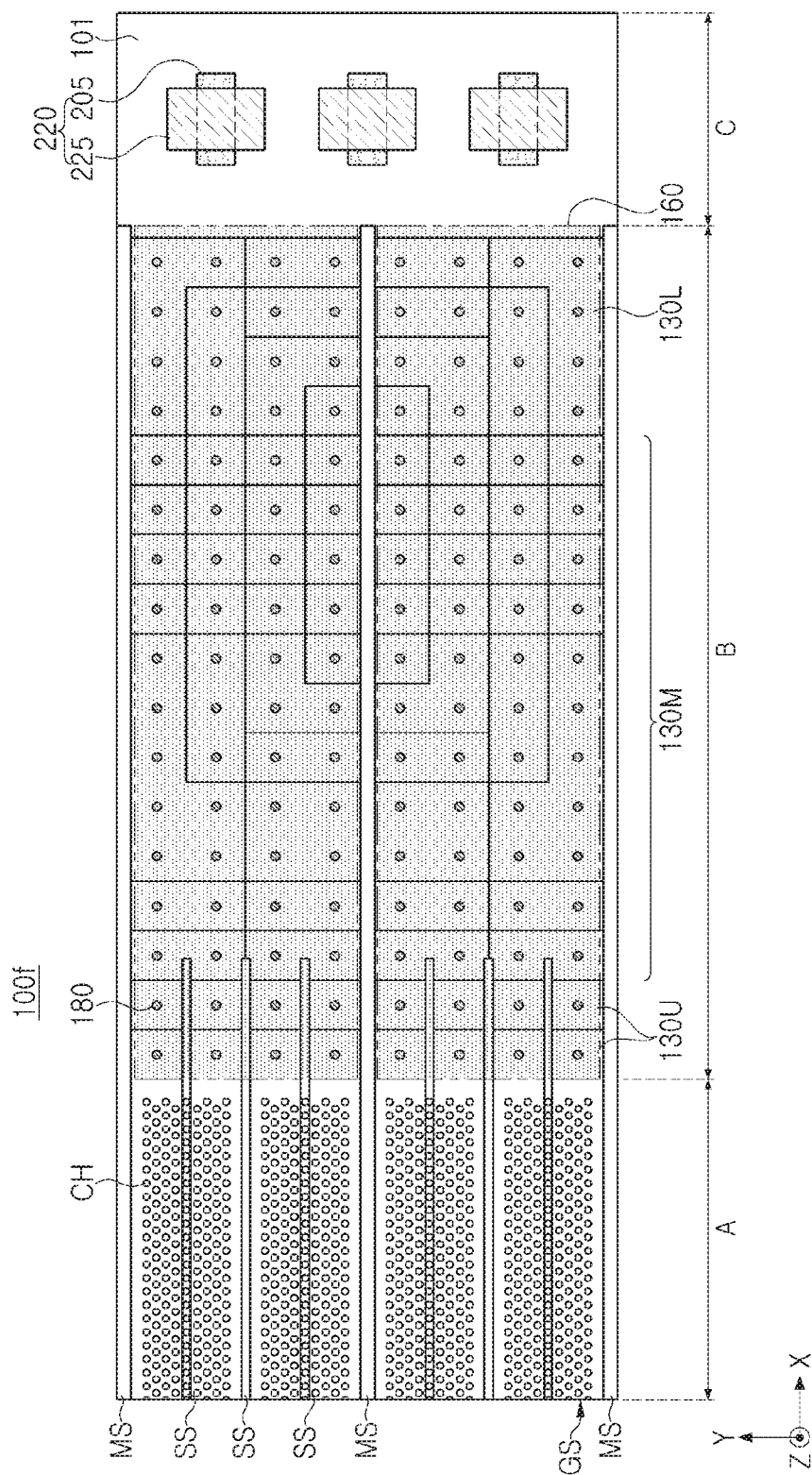
FIG. 8 is a schematic plan view illustrating a semiconductor device according to example embodiments of the inventive concept.

FIG. 8 is a schematic plan view illustrating a semiconductor device according to an example embodiment of the inventive concept.

Referring to FIG. 8, in a semiconductor device 100f, a substrate 101 may further include a third region C in addition to a first region A and a second region B. The third region C may be located outside of the second region B, not facing the first region A. The third region C may be a peripheral circuit region in which circuit elements 220 electrically connected to gate electrodes 130 are arranged. Each of the circuit elements 220 may include an active region 205 and a circuit gate electrode 225. A circuit gate insulating layer may be interposed between the circuit gate electrode 225 and the active region 205. In example embodiments, the circuit elements 220 may have various sizes and arrangements.

In an example embodiment of the inventive concept, an etch-stop layer 160 is not disposed in the first region A and is not disposed in the third region C. Therefore, in the etch-stop layer 160, a first end portion in the x direction may be located at or near a boundary between the first region A and the second region B, and a second end portion on the other side may be located at or near a boundary between the region B and the third region C. For example, the etch-stop layer 160 may extend from the boundary between the first region A and the second region B to the boundary between the second region B and the third region C. In the etch-stop layer 160, both end portions in the y direction may be in contact with side surfaces of the separation regions MS or spaced apart from the side surfaces of the separation regions MS. In an example embodiment of the inventive concept, the separation regions MS are not disposed in the third region C.

Figure 9:
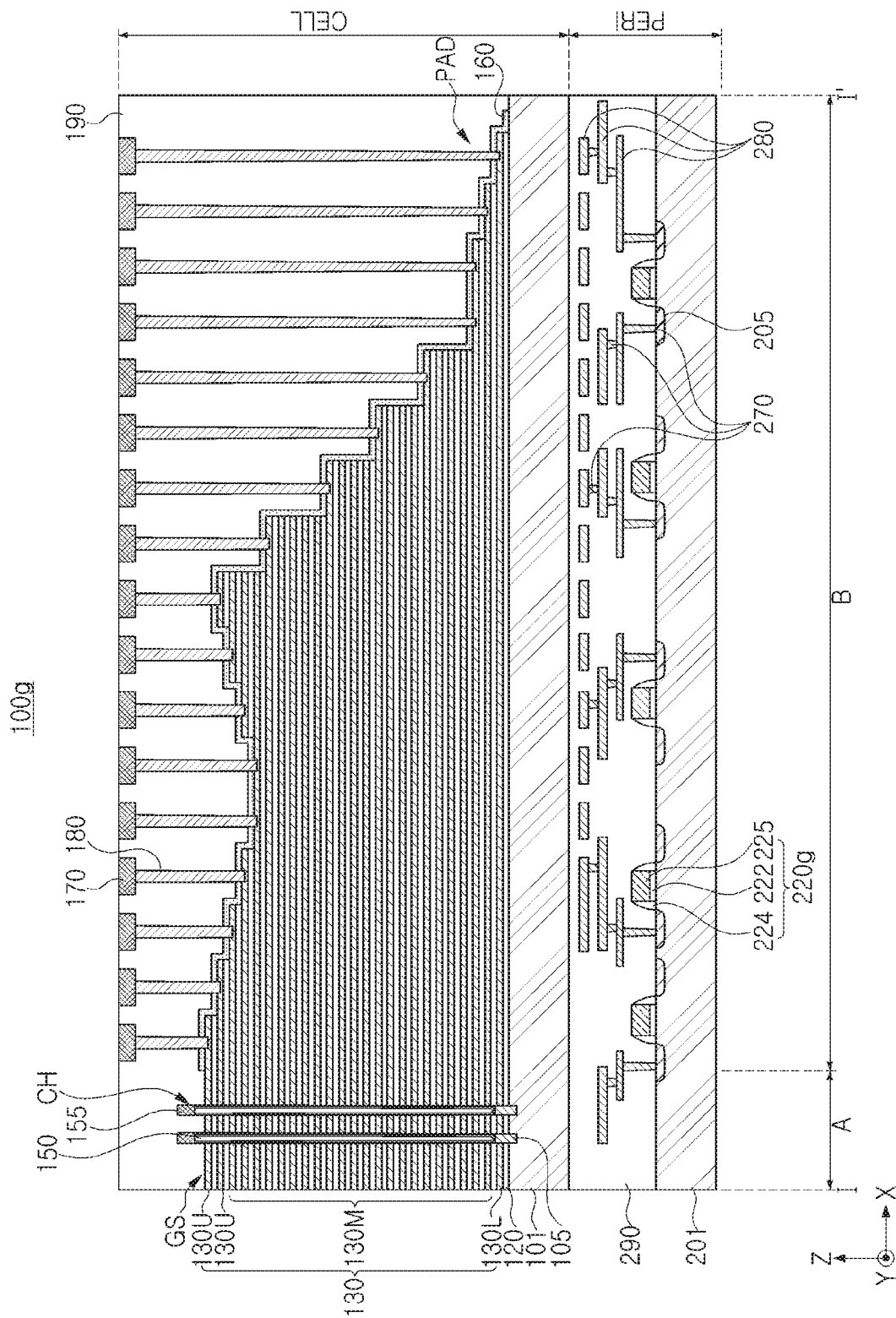
FIG. 9 is a schematic cross-sectional view illustrating a semiconductor device according to example embodiments of the inventive concept.

FIG. 9 is a schematic cross-sectional view illustrating a semiconductor device according to an example embodiment of the inventive concept. FIG. 9 illustrates a region corresponding to FIG. 2A.

Referring to FIG. 9, a semiconductor device 100g includes a memory cell region CELL and a peripheral circuit region PERI. The memory cell region CELL may be disposed on the peripheral circuit region PERI. In an example embodiment, the memory cell region CELL is disposed below the peripheral circuit region PERI.

As described above with reference to FIGS. 1 to 2C, the memory cell region CELL may include the substrate 101, the gate electrodes 130, the channel structures CH, the separation regions MS, the etch-stop layer 160, and contact plugs 180. The memory cell region CELL may have a structure according to various embodiments as described above with reference to FIGS. 3A to 7.

The peripheral circuit region PERI may include a base substrate 201, and circuit elements 220g, circuit contact plugs 270, and circuit wiring lines 280, arranged on the base substrate 201.

The base substrate 201 may have an upper surface extending in the x direction and the y direction. In the base substrate 201, element separation layers may be separately formed to define an active region. Source/drain regions 205 including impurities may be disposed in a portion of the active region. The base substrate 201 may include a semiconductor material, such as a group IV semiconductor, a group III-V compound semiconductor, or a group II-VI compound semiconductor.

The circuit elements 220g may include planar transistors. Each of the circuit elements 220g may include a circuit gate insulating layer 222, a spacer layer 224, and a circuit gate electrode 225. The source/drain regions 205 may be disposed in the base substrate 201 at both sides of a circuit gate electrode 225. For example, one of the source/drain regions 205 disposed at one side of a circuit gate electrode 225 can serve as a source electrode of a transistor and the other one of the source/drain regions 205 disposed at the other side of the circuit gate electrode 225 can serve as a drain electrode of the transistor.

A peripheral region insulating layer 290 may be disposed on the circuit element 220g on the base substrate 201. The circuit contact plugs 270 may pass through the peripheral region insulating layer 290 to be connected to the source/drain regions 205. Electrical signals may be applied to the circuit element 220g by the circuit contact plugs 270. In a region not illustrated, the circuit contact plugs 270 may also be connected to the circuit gate electrode 225. The circuit wiring lines 280 may be connected to the circuit contact plugs 270, and may be disposed as a plurality of layers. In the region not illustrated, the gate electrodes 130 of the memory cell region CELL may be connected to the circuit elements 220g of the peripheral circuit region PERI through a through-via in a through-region passing through the peripheral circuit region PERI.

The semiconductor device 100g may be manufactured by preparing the peripheral circuit region PERI, and forming the substrate 101 of the memory cell region CELL thereon to prepare the memory cell region CELL. The substrate 101 may have the same size as the base substrate 201, or may be formed smaller than the base substrate 201.

FIGS. 10A to 15B are schematic plan and cross-sectional views illustrating a method of manufacturing a semiconductor device according to an example embodiment of the inventive concept.

Figure 10A:
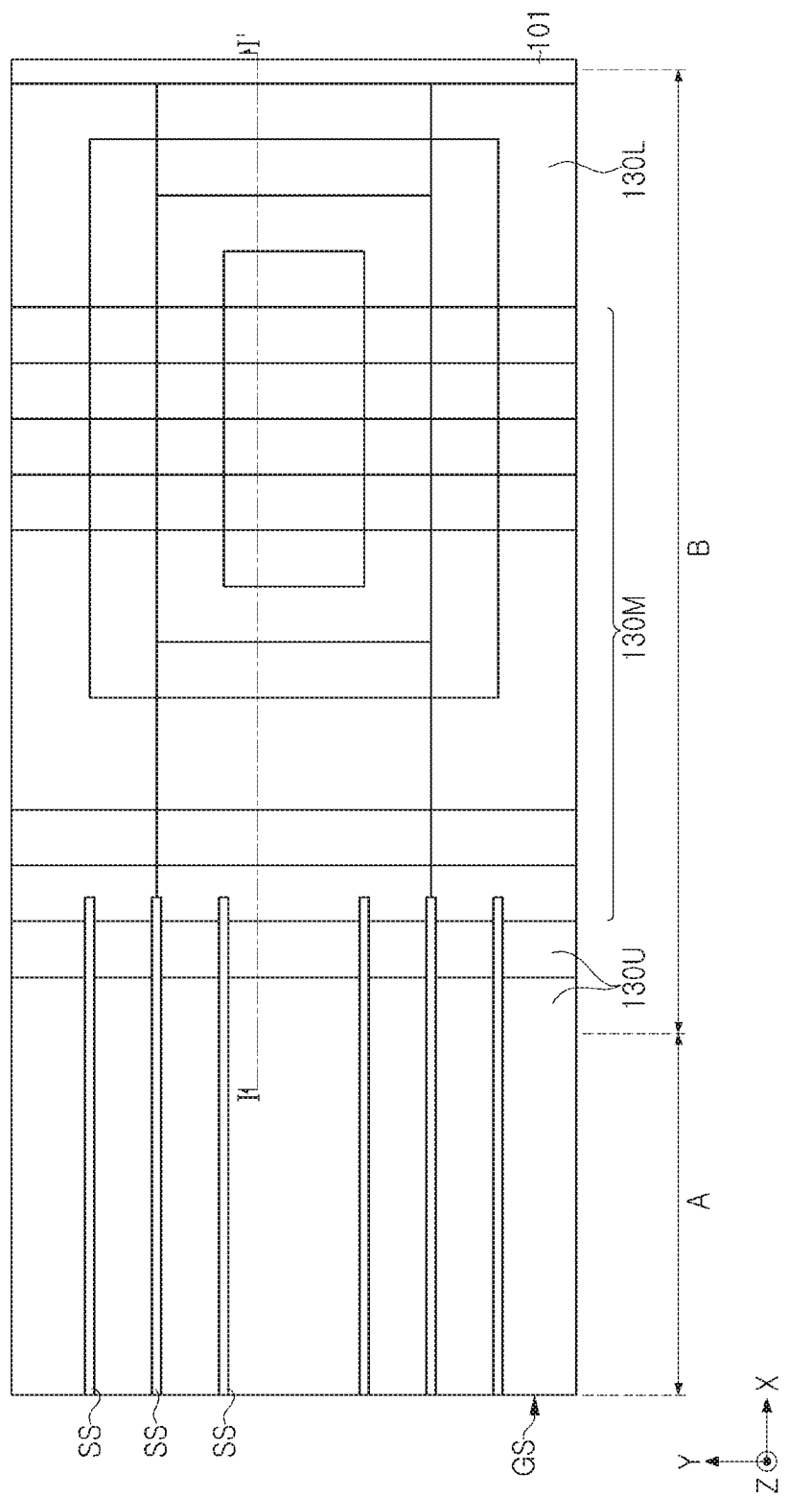

Referring to FIGS. 10A and 10B, gate electrodes 130 and interlayer insulating layers 120 are alternately stacked on a substrate 101, a portion of the gate electrodes 130 and a portion of the interlayer insulating layers 120 are removed so the gate electrodes 130 have different lengths while extending in the x direction, and upper separation regions SS are formed.

The gate electrodes 130 and the interlayer insulating layers 120 may be alternately deposited by a deposition process to form a stacked structure GS. In an example embodiment, thicknesses of the interlayer insulating layers 120 of the stacked structure GS are the same as one another. In an alternate example embodiment, thicknesses of the interlayer insulating layers 120 of the stacked structure GS differ from one another. For example, among the interlayer insulating layers 120, a lowermost interlayer insulating layer 120 may be formed relatively thin, and an uppermost interlayer insulating layer 120 may be formed relatively thick. Thicknesses of the interlayer insulating layers 120 and the gate electrodes 130 and the number of films forming the same may be variously changed, in a different manner to those illustrated.

In a second region B of the substrate 101, photolithography and etching processes may be repeatedly performed on the gate electrodes 130 such that upper gate electrodes 130 extend less than lower gate electrodes 130. For example, widths of upper gate electrodes 130 may be less than widths of lower gate electrodes 130. As a result, the gate electrodes 130 may form a pad region PAD having a stepped shape. In example embodiments, the gate electrodes 130 may have a stepped shape in the x direction only, or may have a stepped shape in both the x direction and the y direction. In the case of the embodiment of FIG. 4, the gate electrodes 130 may be formed to have a relatively thick thickness in end regions RR by further depositing a material forming the gate electrodes 130 in regions exposed by extending the gate electrodes 130 longer than the upper gate electrodes 130.

The upper separation regions SS may be formed by exposing a region in which the upper separation region SS is formed using a mask layer, and removing a predetermined number of gate electrodes 130 and the interlayer insulating layers 120 from an uppermost portion. The upper separation region SS may extend below upper gate electrodes 130U, as illustrated in FIG. 2B. An upper insulating layer 103 may be formed by depositing an insulating material in a region in which the gate electrodes 130 and the interlayer insulating layers 120 are removed. The upper insulating layer 103 may be made of, for example, the same material as the interlayer insulating layer 120.

Figure 11A:
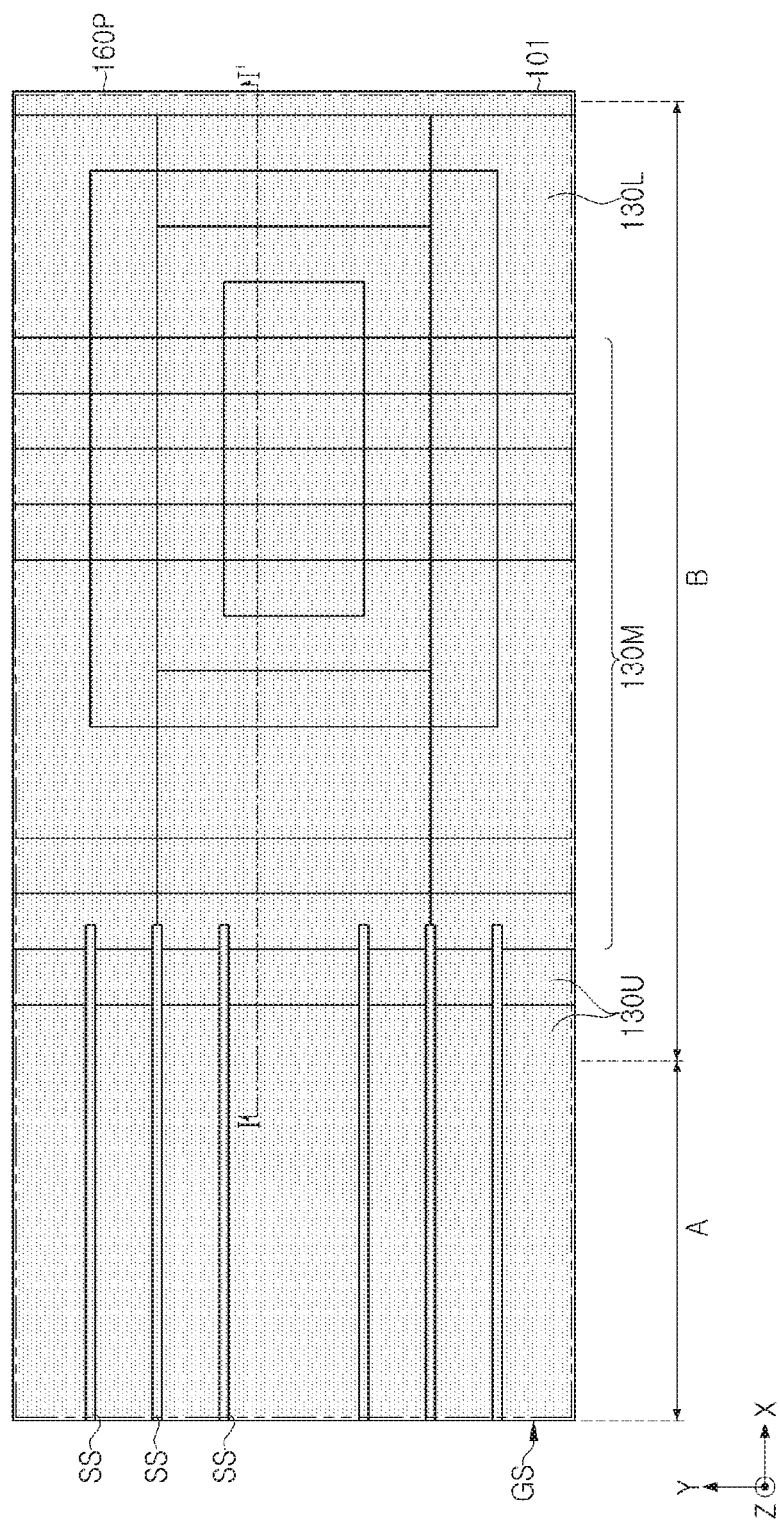
Figure 11B:
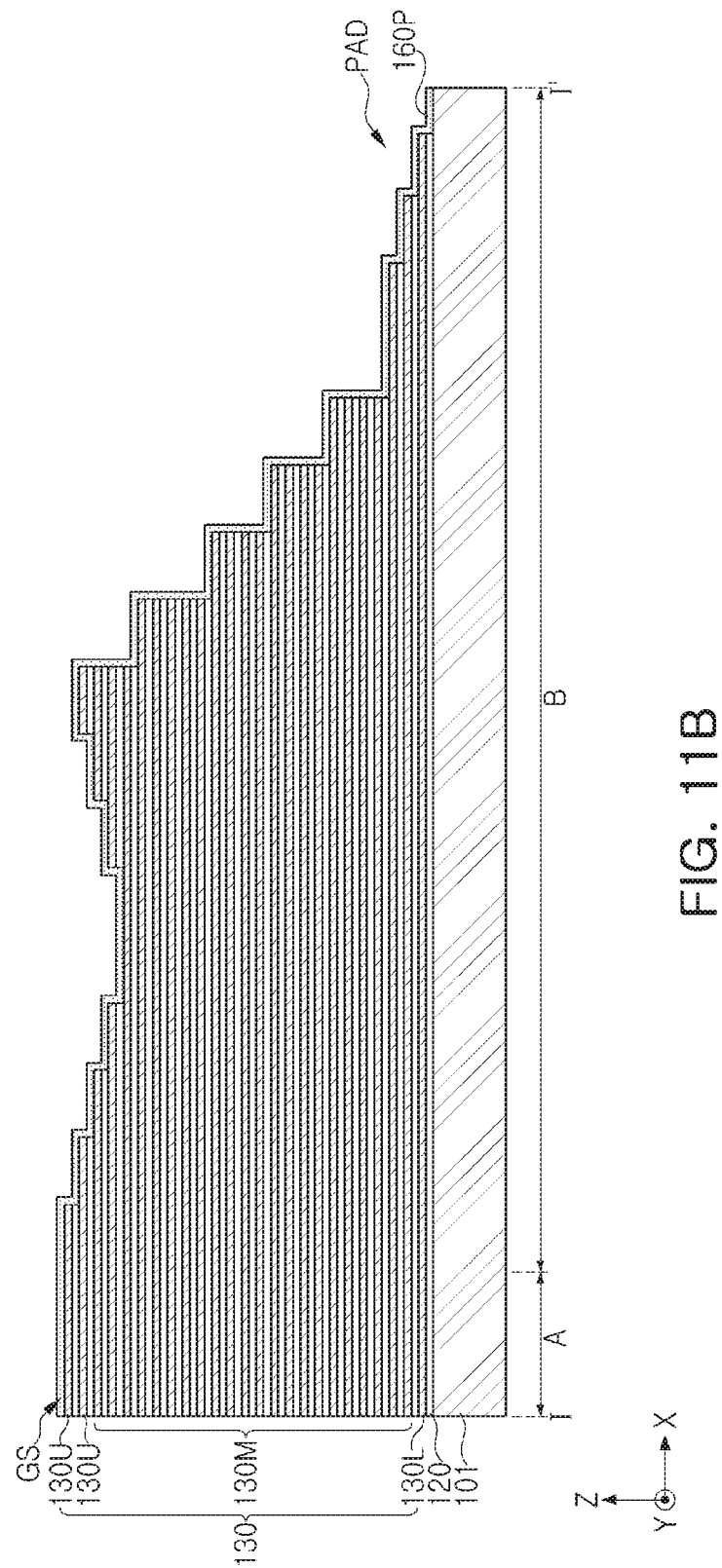

Referring to FIGS. 11A and 11B, a preliminary etch-stop layer 160P is formed to cover the stacked structure GS.

The preliminary etch-stop layer 160P may be formed on the substrate 101 overall. The preliminary etch-stop layer 160P may be formed to cover upper surfaces of uppermost gate electrodes 130 of the stacked structure GS. In the pad region PAD, the preliminary etch-stop layer 160P may cover side surfaces of the gate electrodes 130 and side surfaces of the interlayer insulating layers 120 along a profile of the gate electrodes 130, to be formed to have a stepped shape. The preliminary etch-stop layer 160P may be formed to cover the upper separation regions SS in a first region A of the substrate 101, in addition to upper surfaces of the gate electrodes 130.

In an example embodiment of the inventive concept, the preliminary etch-stop layer 160P includes a material different from the gate electrodes 130 and a cell region insulating layer 190 (see FIG. 2A) to be formed later. The preliminary etch-stop layer 160P may be formed of a material having an etch selectivity to the gate electrodes 130 and the cell region insulating layer 190. For example, the gate electrodes 130 may include polycrystalline silicon, the cell region insulating layer 190 may include silicon oxide or silicon nitride, and the preliminary etch-stop layer 160P may include metal oxide. When the preliminary etch-stop layer 160P includes metal oxide, the preliminary etch-stop layer 160P may be more easily removed by a wet etching process under specific etching conditions, and less easily removed by a dry etching process under specific etching conditions.

Figure 12A:
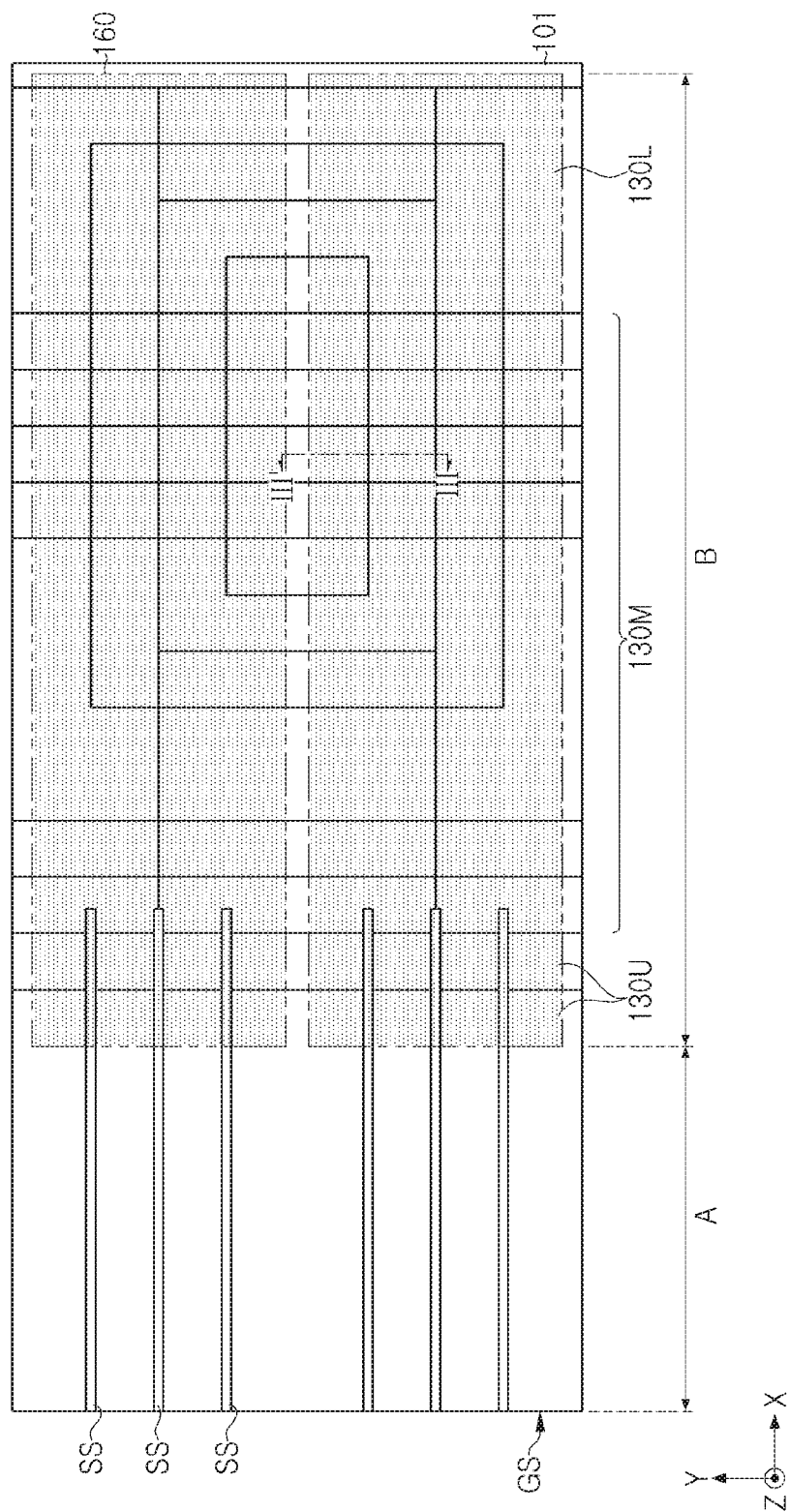
Figure 12B:
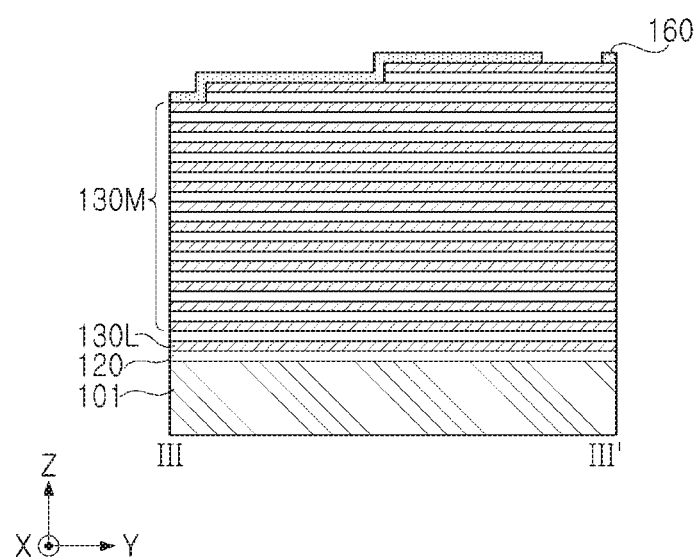

Referring to FIGS. 12A and 12B, the preliminary etch-stop layer 160P is patterned to form an etch-stop layer 160.

The preliminary etch-stop layer 160P may be patterned using a photolithography process and a photomask layer by the process. The preliminary etch-stop layer 160P may be removed in regions in which the separation regions MS (see FIG. 1) are to be formed in the first region A and the second region B. The removal operation may be performed, for example, by a wet etching process. Therefore, the etch-stop layer 160 may remain only in the second region B except for the regions in which the separation regions MS are to be formed. In the embodiment of FIGS. 3A and 3B, in this operation, the preliminary etch-stop layer 160P may be removed in regions including the regions in which the separation regions MS are to be formed and wider than the regions in which the separation regions MS are to be formed. As a result, the etch-stop layer 160a may be formed.

In example embodiments, a heat treatment process for the etch-stop layer 160 may be additionally performed. By the heat treatment process, the etch-stop layer 160 may be hardened to have relatively hard film characteristics.

Figure 13A:
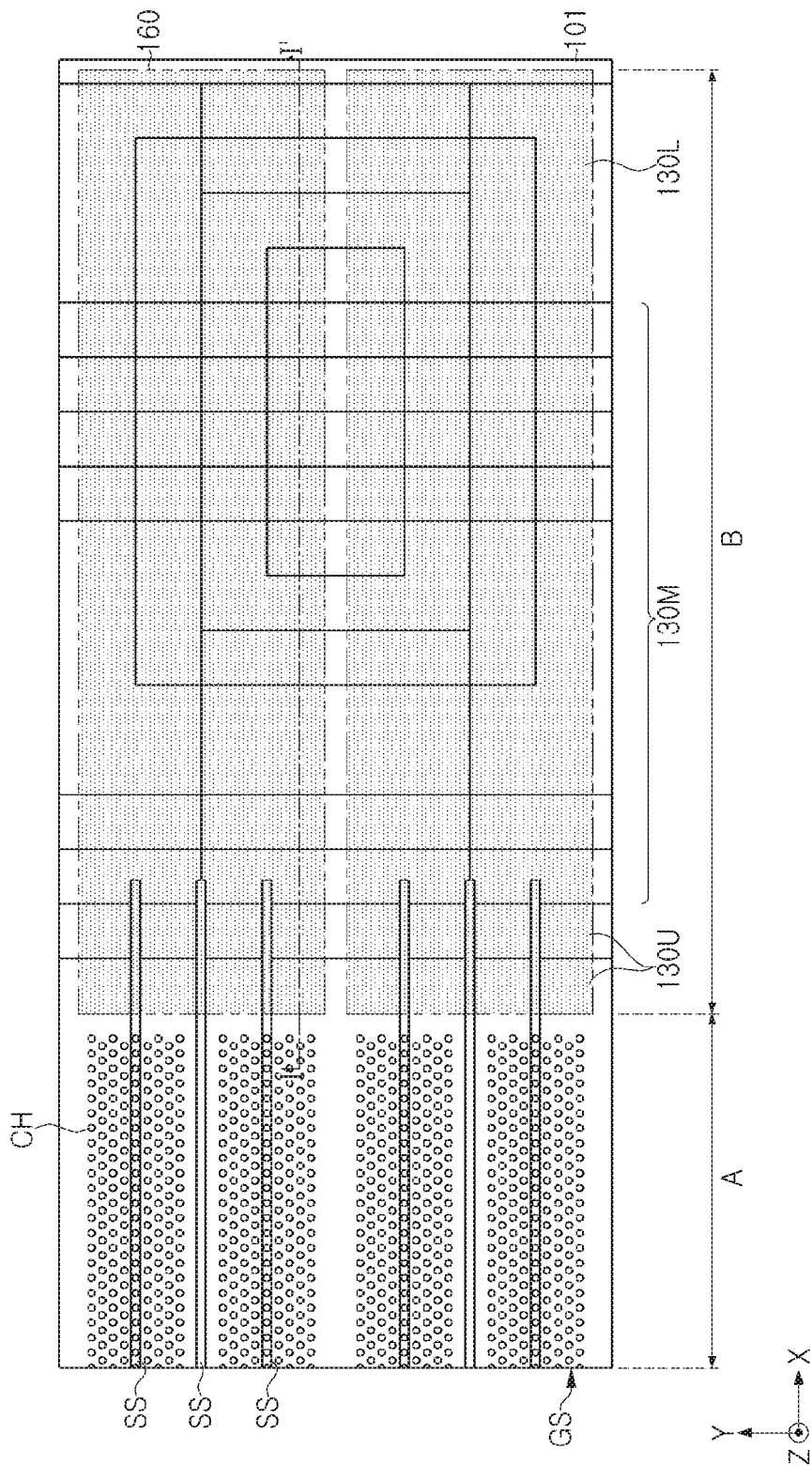
Figure 13B:
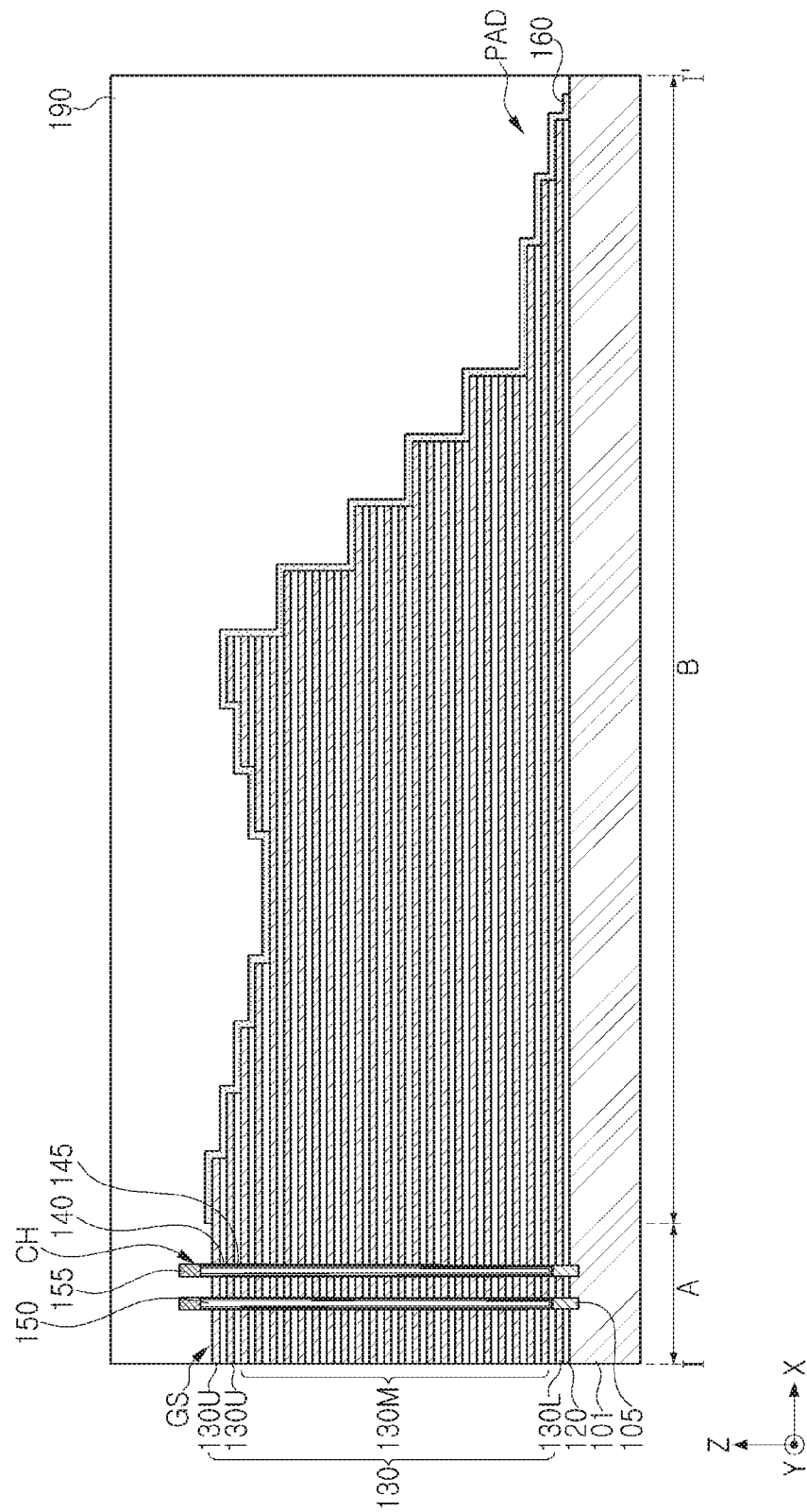

Referring to FIGS. 13A and 13B, channel structures CH are formed to pass through the stacked structure GS.

First, a cell region insulating layer 190 is formed to cover an upper portion of the stacked structure GS. The channel structures CH may be formed by anisotropically etching the gate electrodes 130 and the interlayer insulating layers 120 to form channel holes having a hole shape, and then filling the channel holes. Due to a height of the stacked structure GS, sidewalls of the channel structures CH may not be perpendicular to an upper surface of the substrate 101. The channel structures CH may be formed to recess a portion of the substrate 101. For example, the channel structures CH may extend into recesses of the substrate 101. Since the channel holes may be formed in a region in which the etch-stop layer 160 is not disposed, the formation operation may be easily performed.

Next, an epitaxial layer 105, a gate dielectric layer 145, a channel layer 140, a channel insulating layer 150, and a channel pad 155 are sequentially formed in the channel holes.

The epitaxial layer 105 may be formed using a selective epitaxial growth (SEG) process. The epitaxial layer 105 may be formed as a single layer or a plurality of layers. The epitaxial layer 105 may include polycrystalline silicon, single crystalline silicon, polycrystalline germanium, or single crystalline germanium, with or without doping impurities.

The gate dielectric layer 145 may be formed to have a uniform thickness using an atomic layer deposition (ALD) process or a chemical vapor deposition (CVD) process. The channel layer 140 may be formed on the gate dielectric layer 145 in the channel structure CH. The channel insulating layer 150 may be formed to fill the channel structure CH, and may be an insulating material. In an example embodiment of the inventive concept, an inside of the channel layer 140 is also filled with a conductive material, instead of the channel insulating layer 150. The channel pad 155 may be made of a conductive material, for example, made of polycrystalline silicon.

Figure 14A:
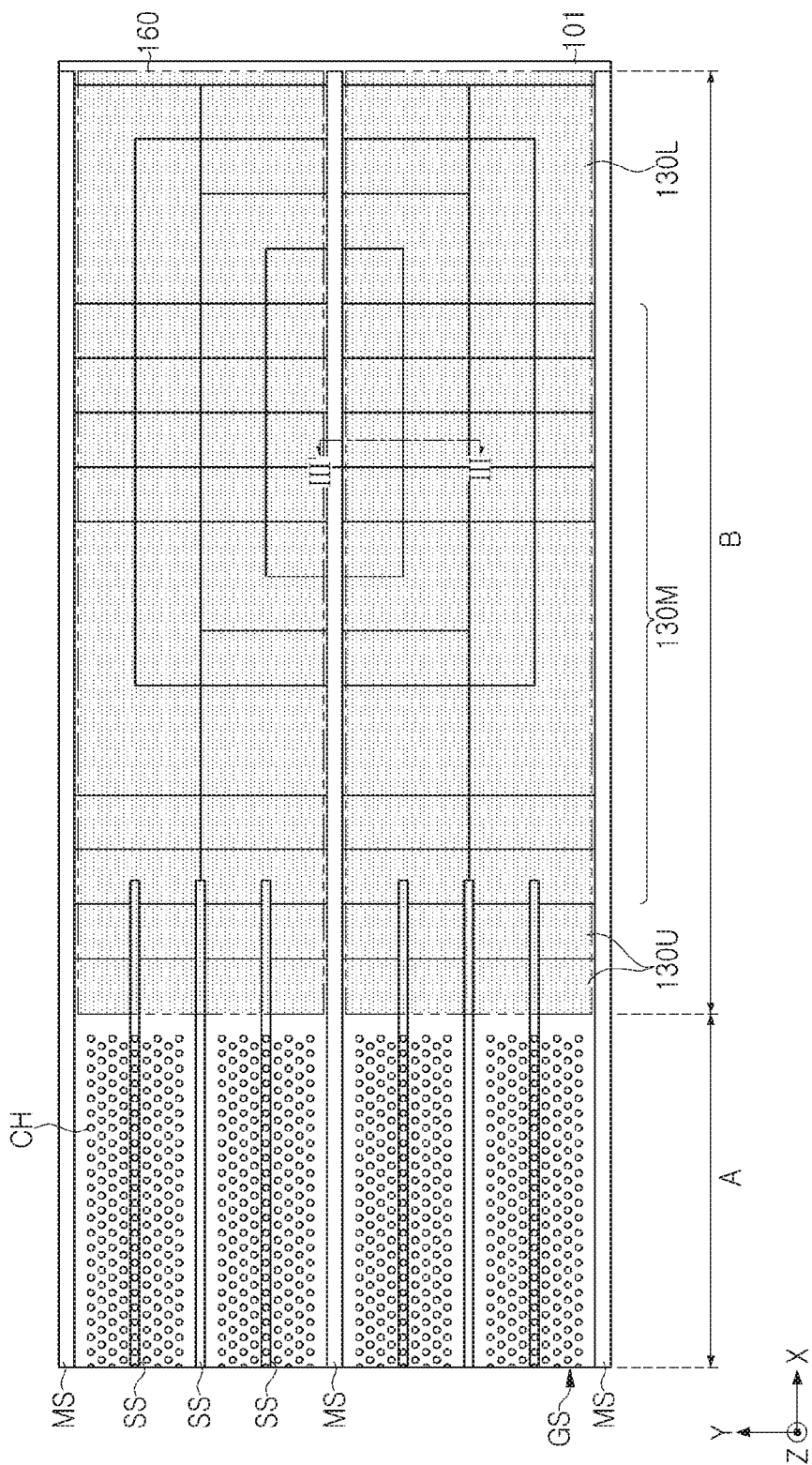
Figure 14B:
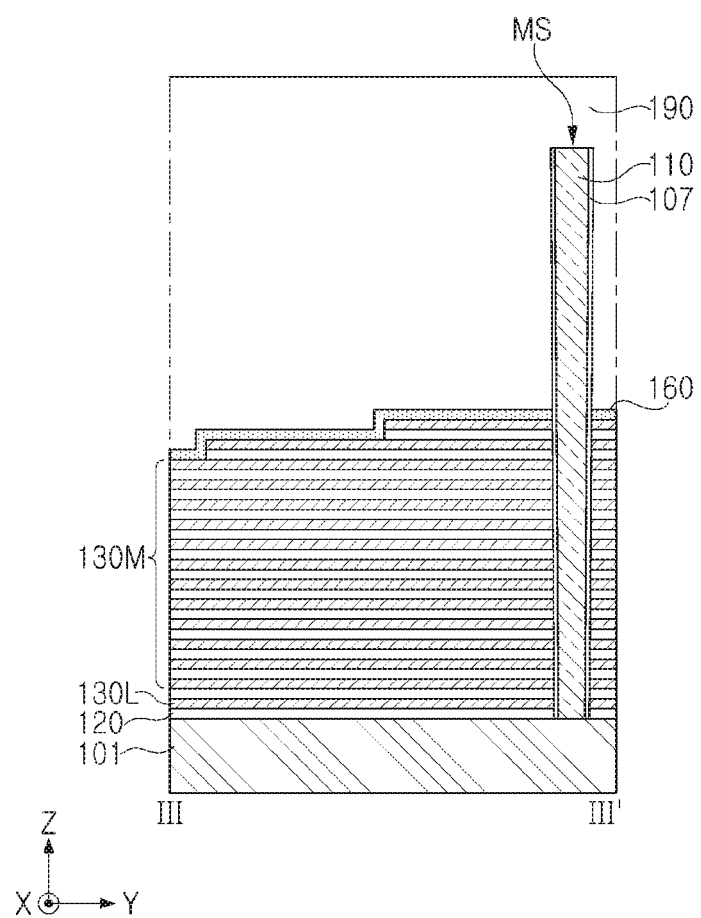

Referring to FIGS. 14A and 14B, separation regions MS passing through the stacked structure GS may be formed.

In an example embodiment, first, openings (or through holes) are formed in a region in which the separation regions MS are to be formed by forming a mask layer using a photolithography process and etching (e.g., anistropically etching) the stack structure GS. Before forming the openings, the cell region insulating layer 190 may be further formed on the channel structures CH to protect structures below the channel structures CH. Next, conductive layers 110 and separation insulating layers 107 are formed in the openings to form the separation regions MS.

Since the etch-stop layer 160 is not disposed in the region in which the separation regions MS are to be formed, the process of forming the openings may be easily performed. In detail, since the gate electrodes 130 may form the pad region PAD in the second region B, the uppermost gate electrodes 130 may be located on different height levels. Therefore, the openings may be formed by etching the stack structure GS including the gate electrodes 130 disposed on different height levels. Even in this case, since the etch-stop layer 160 serving as a barrier of the etching operation is not disposed in the region in which the separation regions MS are to be formed, lower ends of the openings may be formed to have a substantially constant position along the x direction.

Figure 15A:
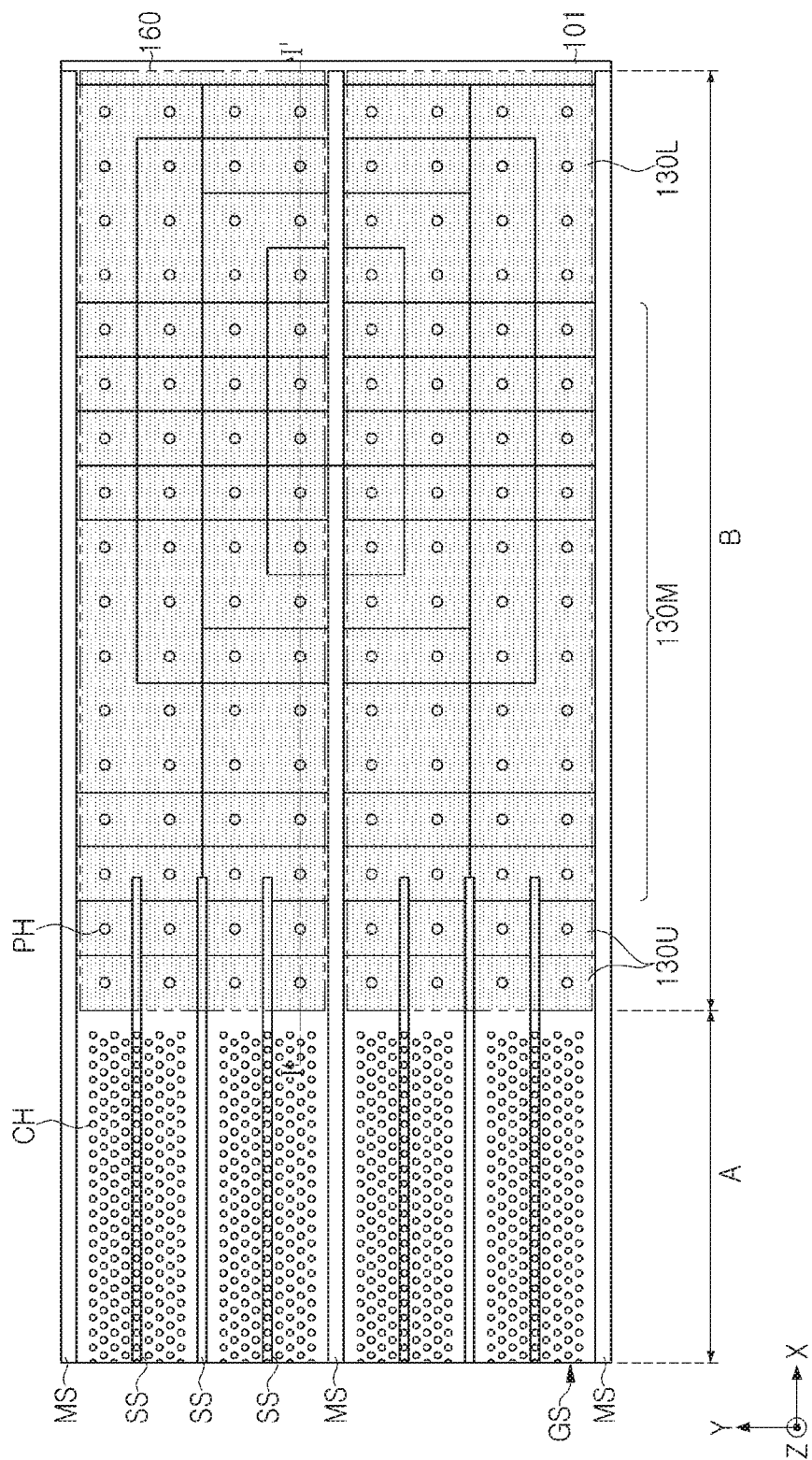
Figure 15B:
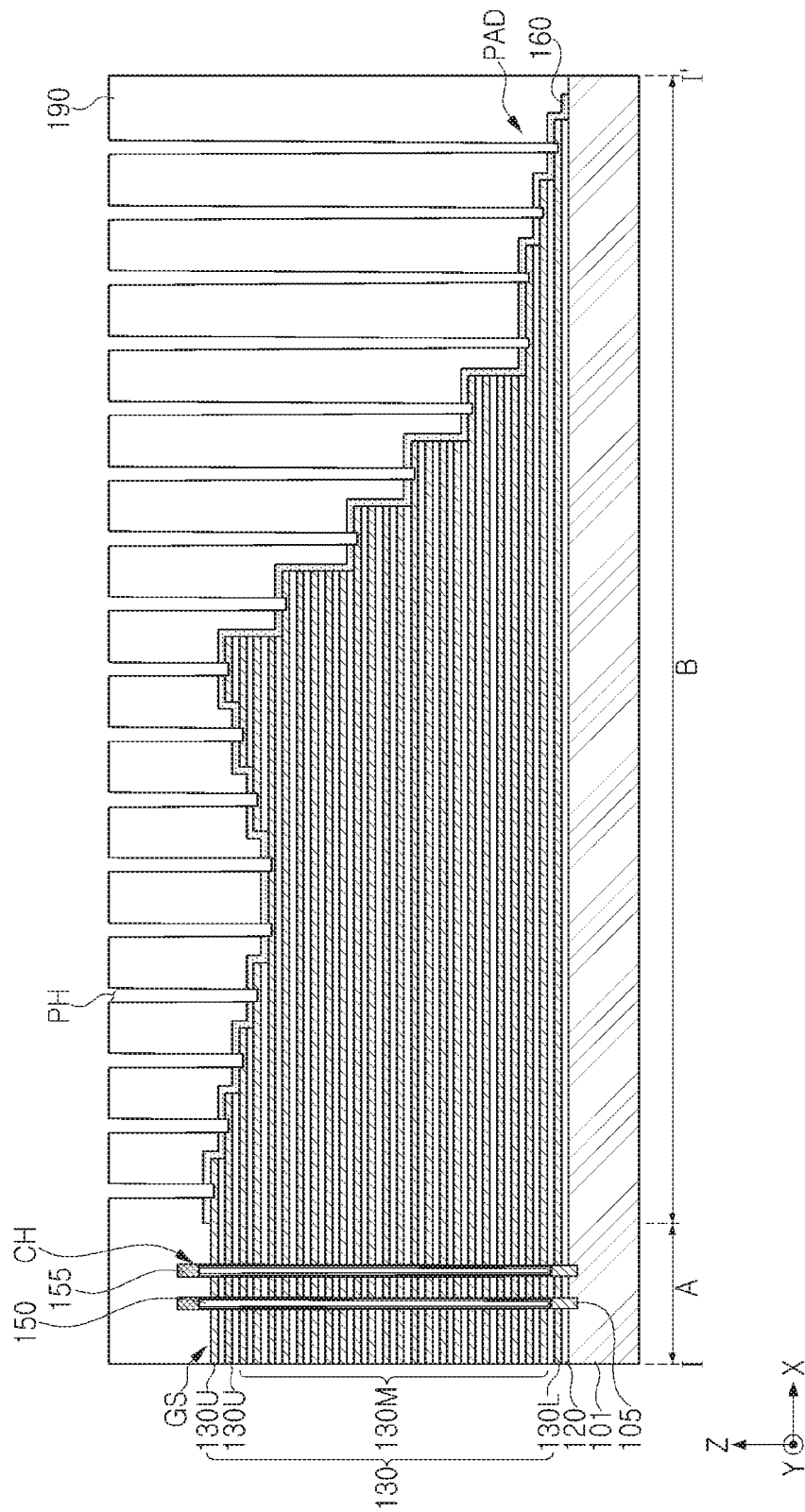

Referring to FIGS. 15A and 15B, contact holes PH passing through the cell region insulating layer 190 are formed to expose the gate electrodes 130 forming the pad region PAD.

An operation of forming the contact holes PH may be performed using two-step etching operations. In a first etching operation, the contact holes PH may pass through the cell region insulating layer 190 from an upper portion to expose the etch-stop layer 160. The contact holes PH may partially recess the etch-stop layer 160. The first etching operation may be performed by, for example, a dry etching process. In a second etching operation, the etch-stop layer 160 exposed by the contact holes PH may be removed to expose the uppermost gate electrodes 130 in a lower portion. The contact holes PH may partially recess the gate electrodes 130. For example, the second etching operation may be performed to remove a portion of the uppermost gate electrode 130 to form a recess in the gate electrode. The second etching operation may be performed by, for example, a wet etching process, and the etch-stop layer 160 may be selectively removed.

In this operation, since the etch-stop layer 160 may be disposed on the uppermost gate electrodes 130, the contact holes PH having different depths may be formed simultaneously on the pad region PAD by a minimum number of photolithography processes, for example, by a single photolithography process.

Next, referring again to FIGS. 1 to 2C, contact plugs 180 and wiring lines 170 may be formed.

First, the contact plugs 180 may be formed by filling a conductive material in the contact holes PH. Thereafter, the wiring lines 170 connected to the contact plugs 180 may be formed.

By selectively disposing an etch-stop layer in some regions, a semiconductor device having improved reliability may be realized.

While example embodiments of the inventive concept have been illustrated and described above, it will be apparent to those skilled in the art that modifications and variations could be made without departing from the scope of the present inventive concept.

What is claimed is:

1. A semiconductor device comprising:
a substrate having a first region and a second region;
a plurality of gate electrodes stacked in a first direction on the substrate and spaced apart from each other in the first region, the gate electrodes extending along a second direction into the second region by different lengths to form a pad region having a stepped shape;
a plurality of interlayer insulating layers alternately stacked with the gate electrodes;
a plurality of channel structures passing through the gate electrodes in the first region, extending in the first direction, and including a channel layer;
a plurality of separation regions passing through the gate electrodes in the first and second regions and extending in the second direction;
an etch-stop layer disposed on uppermost gate electrodes, among the gate electrodes forming the pad region in the second region, not to overlap the first region and the separation regions;
a cell region insulating layer covering the gate electrodes and the etch-stop layer; and
a plurality of contact plugs passing through the cell region insulating layer and the etch-stop layer in the second region and connected to the gate electrodes in the pad region,
wherein the etch-stop layer is spaced apart from sides surfaces of the separation regions.

2. The semiconductor device according to claim 1, wherein the etch-stop layer is spaced apart from side surfaces of the channel structures.

3. The semiconductor device according to claim 1, wherein the etch-stop layer extends continuously along the pad region to have a stepped shape.

4. The semiconductor device according to claim 1, wherein the etch-stop layer includes metal oxide.

5. The semiconductor device according to claim 1, wherein the gate electrodes include a semiconductor material.

6. The semiconductor device according to claim 1, wherein the gate electrodes include metal.

7. The semiconductor device according to claim 6, further comprising a plurality of dummy channel structures passing through the gate electrodes in the second region, extending in the first direction, and including the channel layer.

8. The semiconductor device according to claim 1, wherein the separation regions include a conductive layer and separation insulating layer disposed between the conductive layer and the gate electrodes.

9. The semiconductor device according to claim 1, further comprising at least one horizontal conductive layer disposed horizontally on the substrate and below the gate electrodes and the interlayer insulating layers and disposed to be in direct contact with the channel layer.

10. The semiconductor device according to claim 1, wherein an end of the etch-stop layer is in contact with an upper surface of the substrate.

11. The semiconductor device according to claim 1, wherein the gate electrodes and the interlayer insulating layers form a first stacked structure and a second stacked structure, stacked in the first direction,
wherein the etch-stop layer includes a first etch-stop layer and a second etch-stop layer, located on each of the first and second stacked structures in the pad region.

12. The semiconductor device according to claim 1, wherein the substrate further has a third region located outside of the second region and in which circuit elements are disposed,
wherein the etch-stop layer extends from a boundary between the first region and the second region to a boundary between the second region and the third region.

13. A semiconductor device comprising:
a plurality of gate electrodes stacked in a first direction on the substrate and spaced apart from each other, the gate electrodes extending by different lengths along a second direction to form a pad region having a stepped shape;
a plurality of separation regions passing through the gate electrodes and extending in the second direction;
an etch-stop layer disposed on uppermost gate electrodes, among the gate electrodes forming the pad region; and
a plurality of contact plugs passing through the etch-stop layer and connected to the gate electrodes in the pad region,
wherein the etch-stop layer is spaced apart from side surfaces of the separation regions.

14. The semiconductor device according to claim 13, further comprising channel structures passing through the gate electrodes, extending in the first direction, and including a channel layer.

15. The semiconductor device according to claim 14, wherein the substrate has a first region and a second region located on at least one side of the first region,
wherein the channel structures are disposed in the first region, and the etch-stop layer is disposed in a portion of the second region.

16. The semiconductor device according to claim 13, further comprising a base substrate spaced apart from the substrate in the first direction and having circuit elements arranged thereon.

17. A semiconductor device comprising:
a substrate having a first region and a second region;
a plurality of gate electrodes stacked in a first direction on the substrate and spaced apart from each other in the first region, the gate electrodes extending along a second direction into the second region by different lengths to form a pad region having a stepped shape;
a plurality of channel structures passing through the gate electrodes in the first region, extending in the first direction, and including a channel layer;
a plurality of separation regions passing through the gate electrodes in the first and second regions and extending in the second direction;

an etch-stop layer disposed on uppermost gate electrodes, among the gate electrodes forming the pad region in the second region; and a plurality of contact plugs passing through the etch-stop layer and connected to the gate electrodes in the pad region, wherein a first end portion of the etch-stop layer in the second direction is located at a boundary between the first region and the second region, and opposing sides of the etch-stop layer are spaced apart from the separation regions.

18. The semiconductor device according to claim 17, wherein a second end portion of the etch-stop layer, opposing the first end portion of the etch-stop layer in the second direction, is located on an upper surface of the substrate.

19. The semiconductor device according to claim 17, wherein the etch-stop layer has a rectangular shape in a plan view.

\* \* \* \* \*